(12) United States Patent
Muranaka

(10) Patent No.: US 7,038,303 B2
(45) Date of Patent: May 2, 2006

(54) SEMICONDUCTOR DEVICE AND METHOD FOR MANUFACTURING THE SAME

(75) Inventor: Koji Muranaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/808,343

(22) Filed: Mar. 25, 2004

(65) Prior Publication Data
US 2004/0188688 A1 Sep. 30, 2004

(30) Foreign Application Priority Data
Mar. 28, 2003 (JP) .............................. 2003-089660

(51) Int. Cl.
*H01L 23/58* (2006.01)
(52) U.S. Cl. ..................... 257/639; 257/640; 257/642
(58) Field of Classification Search ........ 257/639–643, 257/649, 759, 760
See application file for complete search history.

(56) References Cited

U.S. PATENT DOCUMENTS

| 4,714,636 A | * | 12/1987 | Yokono et al. ............. 428/1.31 |
| 6,057,038 A | | 5/2000 | Terashita et al. |
| 6,329,062 B1 | * | 12/2001 | Gaynor ....................... 428/447 |
| 6,559,066 B1 | | 5/2003 | Terashita et al. |
| 6,573,195 B1 | | 6/2003 | Yamazaki et al. |
| 2002/0018881 A1 | | 2/2002 | Terashita et al. |
| 2003/0031877 A1 | * | 2/2003 | Veerasamy et al. ......... 428/426 |
| 2004/0061437 A1 | | 4/2004 | Ikagawa |

FOREIGN PATENT DOCUMENTS

JP    10-048607    2/1998

OTHER PUBLICATIONS

Wolf, S., Silicon Processing for the VLSI Era, vol. 2, Lattice Press, 1990, pp. 273-283.*

* cited by examiner

*Primary Examiner*—T. N. Quach
(74) *Attorney, Agent, or Firm*—Eric J. Robinson; Robinson Intellectual Property Law Office, P.C.

(57) ABSTRACT

An object of the present invention is to increase adhesiveness between thin films, particularly a high molecular film formed on an insulating surface, and the present invention provides a semiconductor device with high reliability and a method for manufacturing the semiconductor device with high yield. A semiconductor device of the present invention comprises a laminate structure formed in close contact with an organic insulating film on a hydrophobic surface of an inorganic insulating film including silicon and nitrogen. A film having the hydrophobic surface is an insulating film having a contact angle of water of equal to or more than 30°, preferably of equal to or more than 40°.

18 Claims, 10 Drawing Sheets hydrogenation by heating hydrogenation by heating

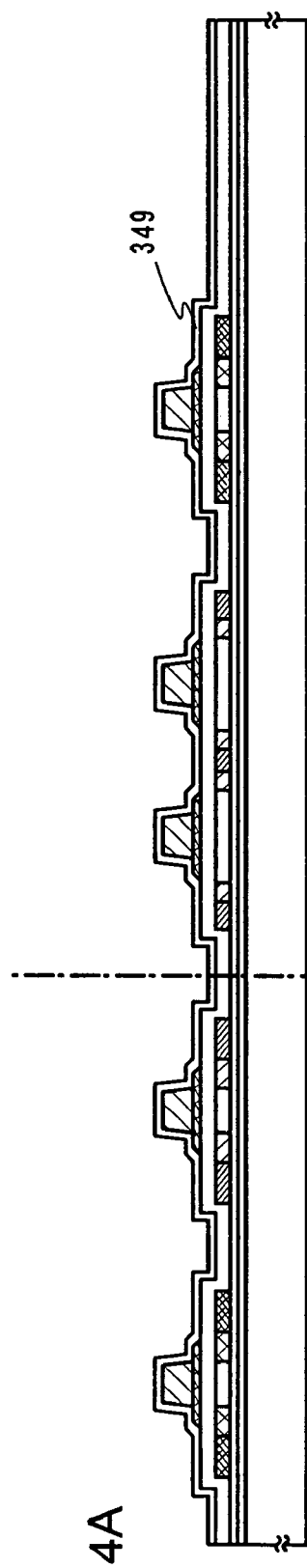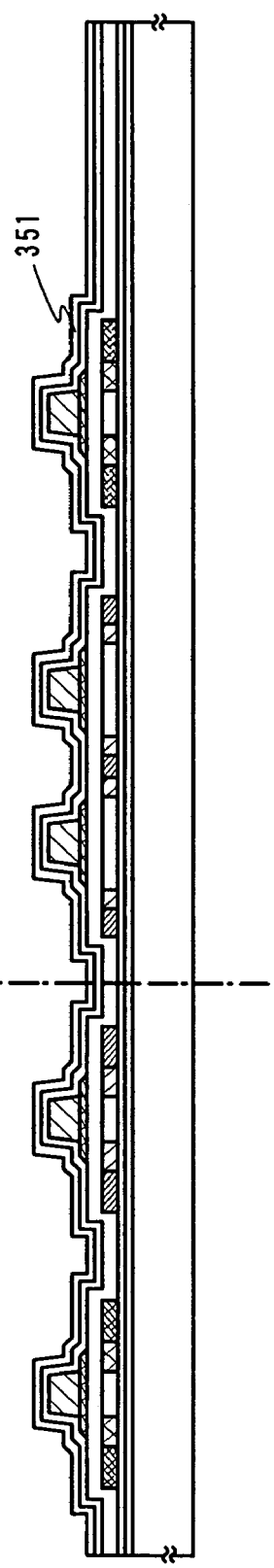
Fig. 4A
Fig. 4B

SEMICONDUCTOR DEVICE AND METHOD FOR MANUFACTURING THE SAME

BACKGROUND OF THE INVENTION

1. Field of the Invention

The present invention relates to a semiconductor device that is a device that can function by using semiconductor characteristics (for example, a display device, a semiconductor circuit, and electronics) and to a method for manufacturing the semiconductor device.

2. Related Art

A liquid crystal molecule, a pixel electrode, a light-emitting layer, and the like which are display-related parts are laminated over an interlayer film. Therefore, the interlayer film is required to have a smooth surface to prevent an orientation defect of liquid crystal molecules, an inhomogeneous electric field, a minute defect of a light-emitting layer due to unevenness of a pixel electrode, and the like.

An organic insulating film is used as the interlayer film over an inorganic insulating film because of its good smoothness (for instance, Reference 1: Japanese Unexamined Patent Publication No. Hei10-48607). An organic insulating film has advantage of being formed easily and that a film thickness thereof can be set comparatively freely.

However, when an organic insulating film is used for a planarization film, adhesiveness with an underlying layer film to be laminated becomes a problem depending on a combination of materials. In the case of poor adhesiveness, film peeling is caused. Such the semiconductor device has a low reliability and is manufactured with a lower yield.

SUMMARY OF THE INVENTION

It is an object of the present invention to improve the adhesiveness between thin films, particularly the adhesiveness of an organic insulating film to be formed on an insulating surface. The present invention provides a semiconductor device with high reliability and a method for manufacturing the semiconductor device with a high yield.

A semiconductor device of the present invention has a laminate structure in which an organic insulating film is formed in close contact with a hydrophobic surface of an inorganic insulating film including silicon and nitrogen. Therefore, considering a semiconductor layer side as a bottom, the inorganic insulating film may be laminated either below or above the organic insulating film, and a surface in contact with the organic insulating film has only to be hydrophobic.

In addition, a semiconductor device of the present invention comprises an inorganic insulating film on a semiconductor layer, having a hydrophobic surface and including silicon and nitrogen and an organic insulating film formed in close contact with the hydrophobic surface of the inorganic insulating film.

Besides, a semiconductor device of the present invention comprises a first inorganic insulating film, a second inorganic insulating film having a hydrophobic surface and including silicon and nitrogen on the first inorganic insulating film, and an organic insulating film formed in close contact with a hydrophobic surface of the second inorganic insulating film, over a semiconductor film.

As for the inorganic insulating film, a surface thereof is hydrophilized by a step such as hydrogenation by heating. Therefore, the second inorganic insulating film having a hydrophobic surface may be formed on the first inorganic insulating film hydrophilized by hydrogenation. At that time, hydrogen concentration in the first inorganic insulating film is lowered since hydrogen is released by hydrogenation. Thus, hydrogen concentration in the second inorganic insulating film becomes higher than that in the first inorganic insulating film.

A method for manufacturing the semiconductor device of the present invention comprises the steps of: forming a first inorganic insulating film on a semiconductor layer; heat-treating at a temperature of from 400° C. to 500° C.; forming a second inorganic insulating film having a hydrophobic surface and including silicon and nitrogen on the first inorganic insulating film; and forming an organic insulating film on the second inorganic insulating film.

In addition, a method for manufacturing the semiconductor device of the present invention comprises the steps of: forming a first inorganic insulating film containing hydrogen on a semiconductor layer; reducing a hydrogen content of the first inorganic insulating film by heat-treating at a temperature of from 400° C. to 500° C.; forming the second inorganic insulating film having a hydrophobic surface and including silicon and nitrogen on the first inorganic insulating film; and forming an organic insulating film on the second inorganic insulating film.

Since hydrogenation of the semiconductor layer by heating is caused by entry of hydrogen inside the first inorganic insulating film into the semiconductor layer, hydrogen is released from the first inorganic insulating film by heating, and a hydrogen content in the first inorganic insulating film is lowered. This step is a step of terminating a dangling bond of the semiconductor layer by hydrogen contained in the first inorganic insulating film.

As described above, the second inorganic insulating film having a hydrophobic surface can be formed on the first inorganic insulating film hydrophilized by the step of hydrogenation. Since the organic insulating film has good adhesiveness to a hydrophobic surface, the organic insulating film can be formed on the second inorganic insulating film having a hydrophobic surface, thereby laminating the film with good adhesiveness.

In the present invention, the hydrophobic surface means a surface having a wide contact angle of water, and an insulating surface preferably having a contact angle of equal to or more than 30°, more preferably equal to or more than 40°. Specifically, silicon nitride (SiN), silicon carbide (SiC), and the like can be used for the (first or second) inorganic insulating film.

In the present invention, a silicon oxynitride (SiON) film includes Si of from 25 atom % to 35 atom %, oxygen of from 55 atom % to 65 atom %, nitrogen of from 1 atom % to 20 atom %, and hydrogen of 0.1 atom % to 10 atom % is shown. A silicon nitride oxide (SiNO) film includes Si of from 25 atom % to 35 atom %, oxygen of from 15 atom % to 30 atom %, nitrogen of from 20 atom % to 35 atom %, and hydrogen of from 15 atom % to 25 atom %.

The (first or second) inorganic insulating film used in the present invention may be an inorganic insulating film including oxygen. And the inorganic insulating film preferably has nitrogen concentration of at least 25 atom % or oxygen concentration of at most 25 atom %. Specifically, a silicon nitride oxide (SiON) film can be used.

The hydrophobic surface may be formed by nitrogen plasma treatment or fluorine plasma treatment with a non-depositional gas. As for the non-depositional gas, $N_2O$, $N_2$, $NH_3$, $F_2$, $CF_4$, $SiF_4$, or the like can be used.

In the present invention, as the organic insulating film, a film comprising one kind of or a plurality kinds of organic resin materials selected from acrylic resin, polyamide, or polyimide of photosensitive or nonphotosensitive, for example, is used. The organic insulating film may be an insulating film including an organic material or an inorganic substance including an organic material. For instance, the organic insulating film can be formed of an inorganic siloxane material and an organosiloxane material substituted for hydrogen bonded silicon by an organic radical such as methyl and phenyl including a Si—O—Si bond among compounds comprising silicon, oxygen, and hydrogen formed by using a siloxane material as a starting material.

The semiconductor device of the present invention has a film having a hydrophobic surface below the organic insulating film, thereby improving the adhesiveness and not causing film peeling. Therefore, the semiconductor device of the present invention has high reliability and the semiconductor device can be manufactured with high yield.

By applying the present invention, the following effect and the like can be obtained.

The present invention prevents film peeling by forming the insulating film having a hydrophobic surface below the organic insulating film to be used as the interlayer film to improve the adhesiveness of these films. Therefore, according to the present invention, a semiconductor device having high reliability can be manufactured with high yield.

These and other objects, features and advantages of the present invention will become more apparent upon reading of the following detailed description along with the accompanied drawings.

BRIEF DESCRIPTION OF THE DRAWINGS

In the accompanying drawings:

FIGS. 4A and 4B are cross-sectional views showing a step of manufacturing an active matrix substrate;

DETAILED DESCRIPTION OF THE INVENTION

EMBODIMENT

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein. Note that, in a structure of the present invention to be described hereinafter, the same reference numbers are used for devices or portions that have the same function. Descriptions about the same reference numbers are omitted.

Figure 1A:
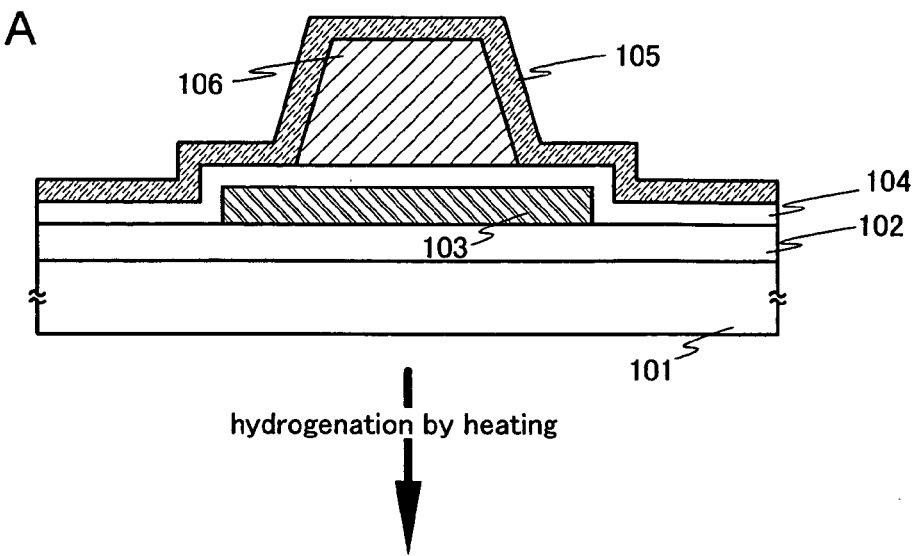
FIGS. 1A to 1C shows a structure of the present invention.
Figure 1B:
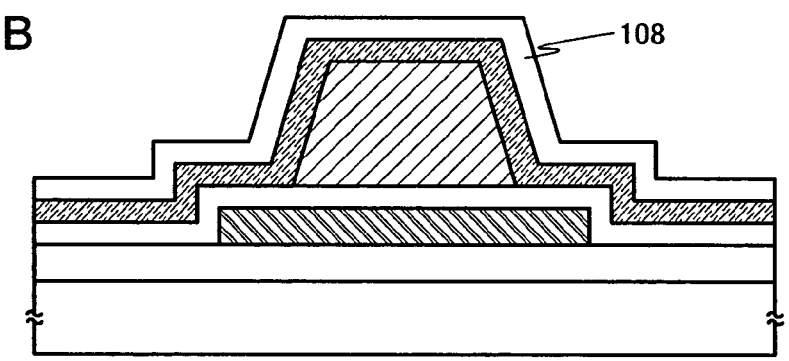
Figure 1C:
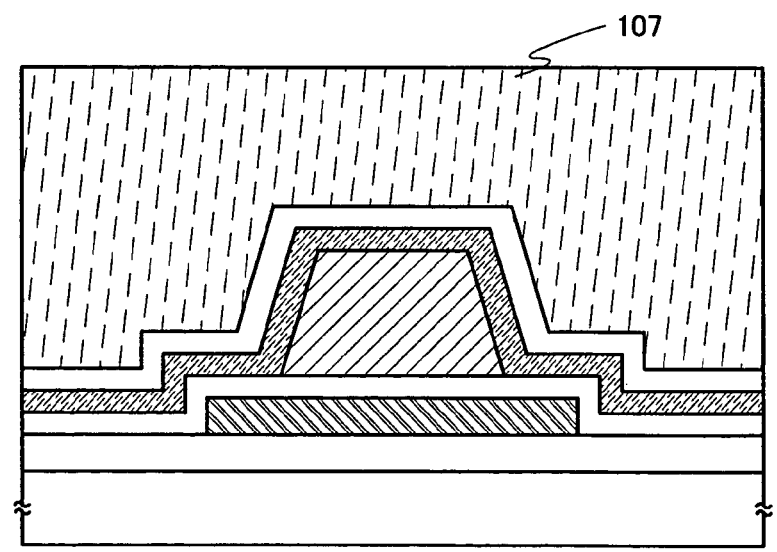

The present invention is shown in FIGS. 1A to 1C. As shown in FIG. 1A, a base film 102 is formed on a substrate 101, and a semiconductor film 103 is formed on the base film 102. For the substrate 101 over which the semiconductor film 103 is formed, a glass substrate, a quartz substrate, a plastic substrate, a metal substrate, a flexible substrate, or the like can be used. As the glass substrate, a substrate made of glass such as barium borosilicate glass or aluminoborosilicate glass is given. The flexible substrate is a film-shaped substrate made of PET, PES, PEN, acrylic, and the like. When a semiconductor device is manufactured with the use of the flexible substrate, weight saving is anticipated. Preferably, a barrier layer such as an aluminum film (AlON, AlN, AlO, or the like), a carbon film (DLC (diamond like carbon), or the like), and SiN is preferably formed to be single-layered or multilayered on a top surface or top and rear surfaces of the flexible substrate, thereby improving durability, and the like.

The base film 102 is typically formed of a material selected from silicon nitride (referred to as SiN), silicon oxide (referred to as $SiO_2$), silicon nitride oxide (referred to as SiNO), aluminum nitride (referred to as AlN), aluminum oxynitride having more oxygen content than nitrogen content (referred to as AlON), aluminum nitride oxide having more nitrogen content than oxygen content (referred to as AlNO), or aluminum oxide (referred to as AlO). The base film may have a two-layer structure, and may have a single layer structure or a laminate structure with more than two layers.

An aluminum oxynitride (AlON) film including Al of from 30 atom % to 40 atom %, oxygen of from 50 atom % to 70 atom %, nitrogen of from 1 atom % to 20 atom % may be used as the aluminum oxynitride film. An aluminum nitride oxide (AlNO) film including Al of from 30 atom % to 50 atom %, oxygen of from 30 atom % to 40 atom %, nitrogen of from 10 atom % to 30 atom % also may be used as the aluminum nitride oxide film.

There is no particular limitation of a material of the semiconductor film 103; however, the semiconductor film may be formed of silicon or a silicon germanium (SiGe) alloy. As for the semiconductor film 103, an amorphous semiconductor film, a microcrystal semiconductor film, a crystalline semiconductor film, and the like are given, and a compound semiconductor film having an amorphous structure such as an amorphous silicon germanium film and an amorphous silicon carbide film may be applied.

An amorphous semiconductor (typically, hydrogenated amorphous silicon) or a crystalline semiconductor (typically, polysilicon) is used as a material of the semiconductor film. Polysilicon includes so-called high-temperature polysilicon using polycrystalline silicon formed through a process temperature of equal to or more than 800° C. as its main component, so-called low-temperature polysilicon using polycrystalline silicon formed through a process temperature of less than or equal to 600° C. as its main component, crystalline silicon crystallized by adding an element for promoting crystallization, and the like.

As other materials, a semi-amorphous semiconductor or a semiconductor including a crystal phase in a part of the semiconductor film can be used. The semi-amorphous semiconductor is a semiconductor having an intermediate structure between an amorphous structure and a crystalline structure (including a single crystal and a polycrystal) and a third condition that is stable in terms of free energy, and is a crystalline semiconductor having short-distance order and lattice distortion. Typically, the semi-amorphous semiconductor is a semiconductor having silicon as a main component wherein Raman spectrum is shifted to a lower wavenumber side than 520 cm$^{-1}$ with lattice distortion. Further, the semiconductor includes hydrogen or halogen of at least 1 atom % or more as a neutralizing agent of a dangling bond. Here, the semiconductor is referred to as a semi-amorphous semiconductor (hereinafter, referred to as a "SAS"). The SAS is also referred to as a so-called microcrystal semiconductor (typically, microcrystal silicon).

The SAS is obtained by grow discharge decomposition (plasma CVD) of a silicide gas. A typical silicide gas is SiH$_4$, and the other gases such as Si$_2$H$_6$, SiH$_2$Cl$_2$, SiHCl$_3$, SiCl$_4$, SiF$_4$, or the like can be used instead. In addition, GeF$_4$ or F$_2$ may be mixed with each of the above gases. The SAS can be formed easily with the use of the silicide gas diluted with hydrogen or one kind of or plural kinds of noble gas elements selected from hydrogen, helium, argon, krypton, and neon. A dilution ratio of hydrogen to the silicide gas is preferably set from 2 to 1000 times in a flow ratio, for example. Of course, the formation of the SAS by the grow discharge decomposition is preferably performed under reduced pressure; however, discharge at atmospheric pressure also can be applied to form the SAS. Typically, the formation of the SAS may be performed within a pressure range of from 0.1 Pa to 133 Pa. A power supply frequency to form glow discharge is set at from 1 MHz to 120 MHz, preferably from 13 MHz to 60 MHz. High-frequency power may be set appropriately. A substrate heating temperature is preferably at equal to or less than 300° C., and the SAS can be formed at a substrate heating temperature of from 100° C. to 200° C. Here, as an impurity element taken in mainly at the time of film formation, impurities in atmospheric constituents such as oxygen, nitrogen, and carbon are preferably set at equal to or less than $1\times10^{20}$ cm$^{-3}$. Specifically, oxygen concentration is preferably set at equal to or less than $5\times10^{19}$ cm$^{-3}$, more preferably equal to or less than $1\times10^{19}$ cm$^{-3}$. Stability is increased by further promoting lattice distortion with a noble gas element such as helium, argon, krypton, and neon included in the SAS to obtain a favorable SAS. A SAS layer formed with a fluorinated gas may be laminated with a SAS layer formed with a hydrogenated gas as a semiconductor layer.

Subsequently, a gate insulating film 104 covering the semiconductor film 103 is formed. Materials of the above-described base film 102 may be used for the gate insulating film 104. The gate insulating film 104 is not limited to a single layer, and a laminated layer with plural kinds of insulating films selected from the above-described materials.

Subsequently, a conductive film 106 to be a gate electrode is formed on the gate insulating film. The conductive film 106 may be formed of an element selected from Ta, W, Ti, Mo, Al, Cu or an alloy material or a compound material having the foregoing element as a main component. As the conductive film 106, a semiconductor film represented by polycrystalline silicon film doped with an impurity element such as phosphorus or an AgPdCu alloy may be used. In addition, a two-layer structure may be employed without limiting to a single layer structure, and, for example, a three-layer structure sequentially laminated with a tungsten film, an alloy film of aluminum and silicon (Al—Si), and a titanium nitride film may be employed.

Subsequently, a first inorganic insulating film 105 is formed. Besides, a step of hydrogenating the semiconductor layer is performed by heat-treating at from 300° C. to 550° C. for from 1 to 12 hours in a nitrogen atmosphere. The step is preferably performed at a temperature of from 400° C. to 500° C. The step is a step of terminating dangling bonds of the semiconductor layers by hydrogen contained in the first inorganic insulating film 105. Since the hydrogenation is caused by entry of hydrogen in the first inorganic insulating film into the semiconductor layer, hydrogen is released from the first inorganic insulating film, and the hydrogen concentration in the first inorganic insulating film is lowered.

The first inorganic insulating film 105 is formed of a material selected from silicon nitride, silicon oxide, silicon nitride oxide having more nitrogen content than oxygen content (SiNO), aluminum nitride (AlN), aluminum oxynitride having more oxygen content than nitrogen content (AlON), or aluminum nitride oxide having more nitrogen content than oxygen content (AlNO), or aluminum oxide.

Before and after the heat treatment, wettability of an insulating film used for the first inorganic insulating film 105 changes. For instance, a silicon nitride film has a contact angle of water of 50° and is hydrophobic after film formation, but the film has a contact angle of 20°, and becomes hydrophilic after hydrogenation.

Figure 2A:
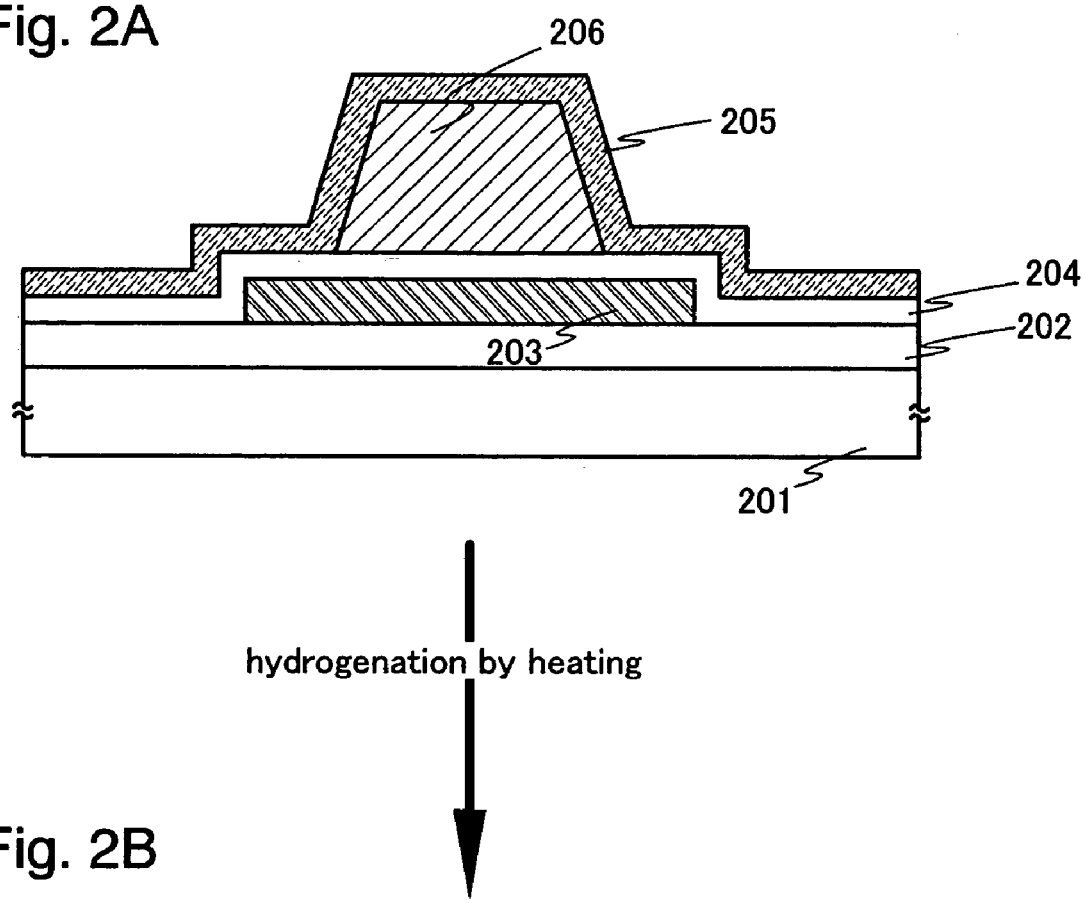
FIGS. 2A and 2B shows a conventional structure.
Figure 2B:
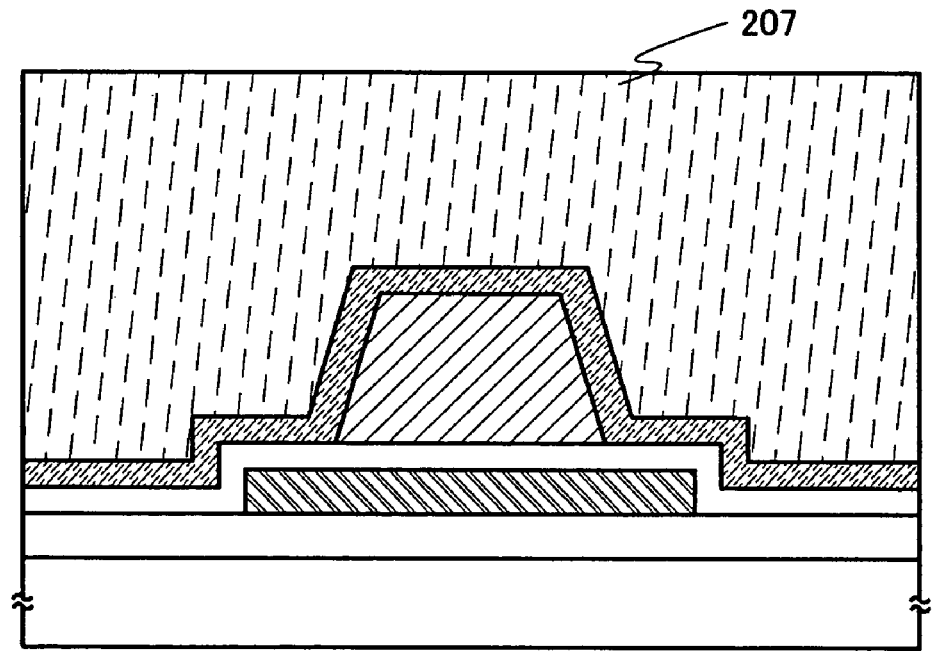

Thus, due to the treatment performed in a step of manufacturing, a surface of a thin film becomes hydrophilic. Although an organic insulating film 207 is formed on a hydrophilized first inorganic insulating film 205 as shown in FIGS. 2A and 2B, the adhesiveness is so poor that a defect such as film peeling is caused.

Therefore, in the present invention, a second inorganic insulating film 108 having a hydrophobic surface is formed on the first inorganic insulating film 105 after hydrogenation as shown in FIG. 1B. The second inorganic insulating film is a film having a hydrophobic surface. The hydrophobic surface means a surface having a wide contact angle of water, and an insulating surface preferably having a contact angle of equal to or more than 30°, more preferably equal to or more than 40°. As for a film having the insulating surface (insulating film), an inorganic insulating film including nitrogen or carbon, or nitrogen and oxygen may be used. Specifically, silicon nitride (SiN), silicon nitride oxide having more nitrogen content than oxygen content (SiNO), silicon carbide (SiC), or the like can be used.

Since the second inorganic insulating film 108 used in the present invention is not heated as the first inorganic insulating film 105, the second inorganic insulating film 108 has higher concentration of contained hydrogen than the first inorganic insulating film 105.

In the case of using an inorganic insulating film including nitrogen and oxygen as the film having the hydrophobic surface (the second inorganic insulating film) used in the present invention, the inorganic insulating film is preferably an inorganic insulating film having nitrogen concentration in the inorganic insulating film of equal to or more than 25 atom % or oxygen concentration in the film of less than or equal to 25 atom %. Specifically, a silicon nitride oxide (SiNO) film having nitrogen concentration of equal to or more than 25 atom % or oxygen concentration of less than or equal to 25 atom % can be used.

In the present invention, a silicon oxynitride (SiON) film denotes a film including Si of from 25 atom % to 35 atom %, oxygen of from 55 atom % to 65 atom %, nitrogen of from 1 atom % to 20 atom %, hydrogen of 0.1 atom % to 10 atom %. A silicon nitride oxide (SiNO) film denotes a film including Si of from 25 atom % to 35 atom %, oxygen of from 15 atom % to 30 atom %, nitrogen of from 20 atom % to 35 atom %, and hydrogen of from 15 atom % to 25 atom %.

The hydrophobic surface may be formed by nitrogen plasma treatment or fluorine plasma treatment with a non-depositional gas. As for the non-depositional gas, N$_2$O, N$_2$, NH$_3$, F$_2$, CF$_4$, SiF$_4$, or the like can be used.

An organic insulating film 107 that is an interlayer film and is made of an organic insulating material is formed on the second inorganic insulating film 108. As the organic insulating film 107, a film comprising one kind of or plural kinds of organic resin materials selected from acrylic resin, polyamide, or polyimide of photosensitive or nonphotosensitive, for example, can be used.

As shown in FIG. 1C, the present invention prevents film peeling by forming an insulating film having a hydrophobic surface below the organic insulating film to be used as the interlayer film to improve adhesiveness of these films. Therefore, according to the present invention, a semiconductor device with high reliability can be manufactured with high yield.

EXAMPLE 1

In this example, focusing attention on a property of materials of an organic insulating film and a base film in contact with a bottom surface of the organic insulating film, particularly on wettability, a relationship between the property and the adhesiveness was derived from an experiment.

In this example, two types of samples were created by forming a silicon nitride film (SiN) and a silicon nitride oxide film (SiNO) on each substrate as base films. As the substrate, a substrate with an insulating film formed on a surface of a glass substrate, a quartz substrate, a silicon substrate, a metal substrate, or a stainless substrate may be used. In this example, the glass substrate was used.

In this example, the silicon nitride film (SiN) was formed to be 100 nm in thickness on the glass substrate by plasma CVD (SiN original sample). In addition, the silicon nitride oxide film (SiNO) was also formed to be 100 nm in thickness on the glass substrate by plasma CVD (SiNO original sample). Nitrogen concentration of the silicon nitride oxide film (SiNO) of this example was 34 atom %, and oxygen concentration was 14 atom %.

Subsequently, each sample was processed to form six types of samples: samples which were processed by hydrofluoric acid treatment for 120 seconds (sample names: SiN(a) and SiNO(a); samples which were processed by hydro washing for 60 seconds and by hydrofluoric acid treatment for 120 seconds (sample names: SiN(b) and SiNO(b); and the SiN original sample and the SiNO original sample without any treatment (sample names: SiN(c) and SiNO(c). Then, all of the six types of samples were washed with water, and the water was vaporized by heating at a temperature of 150° C. for three minutes.

Subsequently, an organic insulating film was formed on six types of samples processed by each treatment. In this example, the organic insulating film was formed by applying a positive photosensitive acrylic resin. Thereafter, peripheries of all the samples were washed, and then, all the samples were exposed to light and developed.

An evaluation of the above-described six types of samples, sample names: the SiN(a); the SiN(b); the SiN(c); the SiNO(a); the SiNO(b); and the SiNO(c); was conducted. Treatment steps and evaluation results of each sample in this example are shown in Table 1.

[Table 1]

Water contact angles of surfaces of the SiN original sample and the SiNO original sample after the deposition and before each treatment were measured with a contact angle measuring instrument. In addition, wettability after the application of the positive photosensitive acrylic resin and adhesiveness of patterns after the development were observed. As for the wettability after the application of an acrylic resin, the case of having had poor wettability and having had some areas that is not covered with the acrylic resin is shown as "x", and the case without any defect is shown as "o". As for pattern adhesiveness after the development, the case that a defect such as film peeling was observed is shown as "x", and the case without any defect is shown as "o".

As shown in Table 1, the silicon nitride films (SiN) showed good wettability after the application of the positive photosensitivity acrylic resin and good pattern adhesiveness with no defect after the development in all of the three samples: the SiN(a); the SiN(b); and the SiN(c). The silicon nitride oxide films (SiNO) showed good wettability in the SiNO(a), the SiNO(b) processed with the hydrofluoric acid treatment; however, the adhesiveness of patterns after the development was so poor that the patterns was removed. However, the SiNO(c) showed good wettability, and pattern peeling after the development did not occur.

On the other hand, as the results of the water contact angle measurement, a contact angle of the silicon nitride film (SiN) was 50° and that of the silicon nitride oxide film was 44°. The wider the contact angle of water was, the more hydrophobic the surface was against water. Therefore, it was found that both of the silicon nitride film (SiN) and the silicon nitride oxide film (SiNO) were hydrophobic, and the silicon nitride film (SiN) was further hydrophobic. It can be said that the more hydrophobic the film surface was, the better the adhesiveness with the organic insulating film was.

Consequently, it was confirmed that the film having hydrophobic surface such as the silicon nitride film (SiN) or the silicon nitride oxide film (SiNO) used in this example had good adhesiveness with the organic insulating film such as the acrylic resin.

COMPARATIVE EXAMPLE

As a comparative example, adhesiveness in the case of forming an organic insulating film by using a silicon oxynitride film (SiON) and a silicon oxide film ($SiO_2$) as a base film was evaluated.

The silicon oxynitride film (SiON) was formed to be 100 nm in thickness on a glass substrate by plasma CVD (SiON original sample). In addition, a silicon oxide film ($SiO_2$) was also formed to be 100 nm in thickness on a glass substrate by plasma CVD ($SiO_2$ original sample). Nitrogen concentration of the silicon oxynitride film (SiON) was 3 atom %, and oxygen concentration was 60 atom % in this comparative example.

Similarly to this example, after treating each of the SiON original sample and the $SiO_2$ original sample, a positive photosensitive acrylic film was formed thereupon by application as an organic insulating film, and evaluations were conducted to each sample. Treatment steps and evaluation results of each sample: SiON(a); SiON(b); SiON(c); $SiO_2$(a); $SiO_2$(b); and $SiO_2$(c); in this comparative example are shown in Table 2.

[Table 2]

As shown in Table 2, all of the six types of the samples: the silicon oxynitride films: the SiON(a); the SiON(b); and the SiON(c); the oxide films: $SiO_2$(a); $SiO_2$(b); $SiO_2$(c); showed good wettability after the application of the positive photosensitive acrylic resin; however, adhesiveness of patterns after development was so poor that the patterns was removed.

On the other hand, as a result of water contact angle measurement, a contact angle of the silicon oxynitride film (SiON) was 24° and that of the silicon oxide film ($SiO_2$) was 15°. Surfaces of the silicon oxynitride film (SiON) and the silicon oxide film ($SiO_2$) used in this comparative example were hydrophilic, whereas the surfaces of the silicon nitride film (SiN) and the silicon nitride oxide film (SiNO) in this example were hydrophobic.

According to the above description, the film having the hydrophilic surface was proved to have poor adhesiveness with the organic insulating film, and the film having the hydrophobic surface was proved to have good adhesiveness with the organic insulating film. Therefore, a structure wherein the organic insulating film was formed on the insulating film having the hydrophobic surface can be said to be a structure with high reliability and having good adhesiveness.

EXAMPLE 2

In this example, a method for manufacturing an active matrix substrate using the present invention is described with reference to FIGS. 3A to 5. An active matrix substrate comprises a plurality of TFTs, but an active matrix substrate comprising a drive circuit portion having an n-channel TFT and a p-channel TFT and a pixel portion having an n-channel TFT is described here.

A silicon nitride oxide film is formed on a substrate 300 having an insulating surface as a base film 301 by plasma CVD to have a thickness of from 10 nm to 200 nm (preferably, from 50 nm to 100 nm) and a silicon oxynitride film is laminated thereupon to have a thickness of from 50 nm to 200 nm (preferably, from 100 nm to 150 nm). In this example, the silicon nitride oxide film of 50 nm and the silicon oxynitride film of 100 nm are formed by plasma CVD. As the substrate 300, a glass substrate, a quartz substrate, a silicon substrate, a metal substrate, or a stainless substrate each of which has an insulating surface on a surface thereof may be used. In addition, a plastic substrate or a flexible substrate having enough heat resistance against a treatment temperature of this example may be used. Further, a two-layer structure may be adopted, and a single layer film or a laminate structure having more than two layers of the base (insulating) film may also be adopted.

Subsequently, a semiconductor film is formed on the base film. The semiconductor film may be formed by a known technique (sputtering, LPCVD, plasma CVD, or the like) to have a thickness of from 25 nm to 200 nm (preferably, from 30 nm to 150 nm). There is no particular limitation of a material of the semiconductor film; however, the semiconductor film may be preferably formed of silicon or a silicon germanium (SiGe) alloy.

In this example, an amorphous silicon film is formed as the semiconductor film by plasma CVD to have a thickness of 54 nm. In this example, the amorphous silicon film is treated by thermal crystallization and laser crystallization with the use of a metal element for promoting crystallization; however, without introducing the metal element into the amorphous silicon film, hydrogen included in the amorphous silicon film may be released to lower hydrogen concentration to $1 \times 10^{20}$ atoms/cm$^3$ or less by heating in a nitrogen atmosphere at a temperature of 500° C. for one hour. Thereafter, the laser crystallization may be performed. The dehydrogenation is performed because the amorphous silicon film is damaged by laser irradiation when the film contains much hydrogen.

Nickel is used as the metal element, and is doped into the amorphous silicon film by solution application. There is no particular limitation of a method for doping the metal element into the amorphous silicon film on condition that the metal element can exist on the surface of or inside the amorphous silicon film, and a method such as sputtering, CVD, plasma treatment (including plasma CVD), adsorption, or a method for applying a metal salt solution can be employed. Among them, a method using a solution is simple and easy, and is useful for easily adjusting concentration of the metal element. Further, at this time, an oxide film is preferably formed by UV rays irradiation in an oxygen atmosphere, thermal oxidation, treatment with ozone water or hydrogen peroxide including hydroxyl radical, or the like in order to improve wettability of the surface of an amorphous semiconductor film and to spread water solution over an entire surface of the amorphous silicon film.

Subsequently, a heat treatment is performed at a temperature of from 500° C. to 550° C. for from 4 hours to 20 hours to crystallize the amorphous silicon film. In this example, after forming a metal-containing layer by solution application with the use of nickel as the metal element and doping nickel into the amorphous silicon film, heat treatment is performed thereto at a temperature of 550° C. for four hours, thereby obtaining a first crystalline silicon film.

Next, a second crystalline silicon film is obtained by irradiating the first crystalline silicon film with laser light to promote crystallization. Laser crystallization is a method for irradiating the semiconductor film with laser light. As for the laser, a solid-state laser, a gas laser, or a metal laser of continuous wave oscillation is preferable to be used. The solid-state laser includes a YAG laser, a $YVO_4$ laser, a YLF laser, a $YAlO_3$ laser, a glass laser, a ruby laser, an alexandrite laser, a Ti:sapphire laser, and the like of continuous wave oscillation; the gas laser includes an Ar laser, a Kr laser, a $CO_2$ laser, and the like of continuous wave oscillation; and the metal laser includes a helium cadmium laser, a copper vapor laser, and a gold vapor laser of continuous wave oscillation. An excimer laser of continuous light emission can also be applied. The laser light may be converted to a harmonic by a non-linear optical device. A crystal used for the non-linear optical device such as LBO, BBO, KDP, KTP, KB5, or CLBO has advantage of conversion efficiency. The conversion efficiency can be drastically raised by introducing these non-linear optical devices into a laser resonator. A laser of the harmonic is typically doped with Nd, Yb, Cr, or the like, and these are excited to oscillate a laser. A kind of the dopant may be selected appropriately. As for the semiconductor film, an amorphous semiconductor film, a microcrystal semiconductor film, a crystalline semiconductor film, and the like are given, and a compound semiconductor film having an amorphous structure such as an amorphous silicon germanium film, an amorphous silicon carbide film, or the like may be applied.

Semiconductor layers 305 to 308 are formed by patterning the thus provided crystalline semiconductor film with the use of photolithography.

After forming the semiconductor layers 305 to 308, a very small amount of an impurity element (boron or phosphorous) may be doped to control a threshold value of a TFT.

Subsequently, a gate insulating film 309 covering the semiconductor layers 305 to 308 is formed. The gate insulating film 309 is formed of an insulating film including silicon to have a thickness of from 40 nm to 150 nm by plasma CVD or sputtering. In this example, a silicon oxynitride film is formed to have a thickness of 115 nm by plasma CVD. The gate insulating film is not limited to the silicon oxynitride film, and other insulating films with a single layer structure or a laminate structure may be used.

Figure 3A:
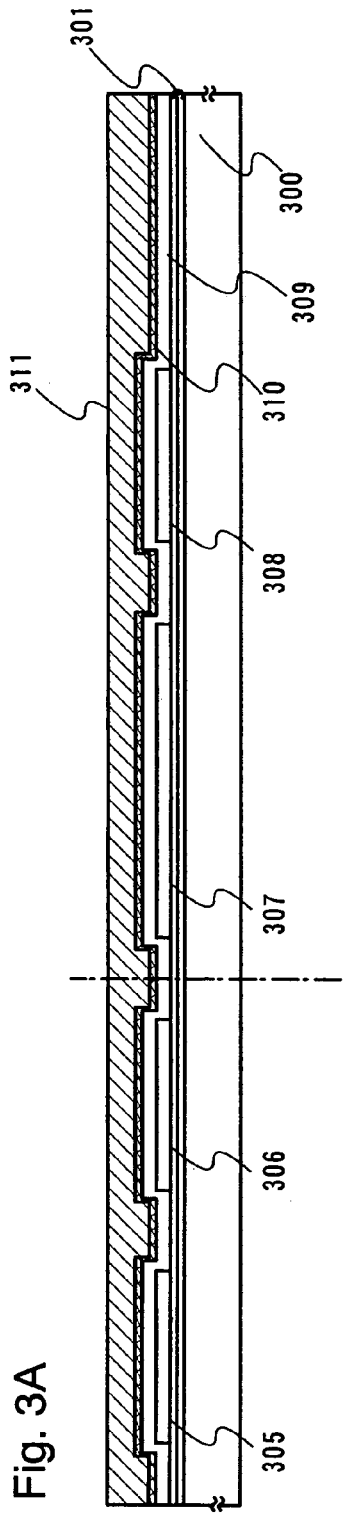
FIGS. 3A to 3C are cross-sectional views showing a step of manufacturing an active matrix substrate.

Subsequently, a first conductive film of a film thickness of from 20 nm to 100 nm and a second conductive film of a film thickness of from 100 nm to 400 nm are formed and laminated over the gate insulating film. The first conductive film and the second conductive film may be formed of an element selected from Ta, W, Ti, Mo, Al, and Cu, or an alloy material or a compound material having the element as a main component. A semiconductor film represented by a polycrystalline silicon film doped with an impurity element such as phosphorus or an AgPdCu alloy may be used as the first conductive film and the second conductive film. Without limited to a two-layer structure, a three-layer structure in which a tungsten film of 50 nm in thickness, an alloy (Al—Si) film of aluminum and silicon of 500 nm in thickness, and a titanium nitride film of 30 nm in thickness are laminated sequentially may be applied. In the case of the three-layer structure, tungsten nitride may be used in place of tungsten of the first conductive film; an alloy (Al—Ti) film of aluminum and titanium may be used in place of an alloy (Al—Si) film of aluminum and silicon of the second conductive film; or a titanium film may be used in place of a titanium nitride film of a third conductive film. Further, a single layer structure may be applied. In this example, a tantalum nitride film 310 of 30 nm in thickness and a tungsten film 311 of 370 nm in thickness are sequentially laminated over the gate insulating film 309 (FIG. 3A).

Next, a mask comprising a resist is formed by photolithography, and a first etching treatment is performed to form an electrode and a wiring. The first conductive film and the second conductive film can be etched into a desired tapered shape by appropriately adjusting etching conditions (such as electric energy applied to a coil-shaped electrode, electric energy applied to an electrode on a substrate side, and temperature of the electrode on the substrate side) with the used of ICP (Inductively Coupled Plasma) etching. For an etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be used appropriately.

A first-shape conductive layer (a first conductive layer and a second conductive layer) comprising a first conductive layer and a second conductive layer is formed by the first etching treatment.

Figure 3B:
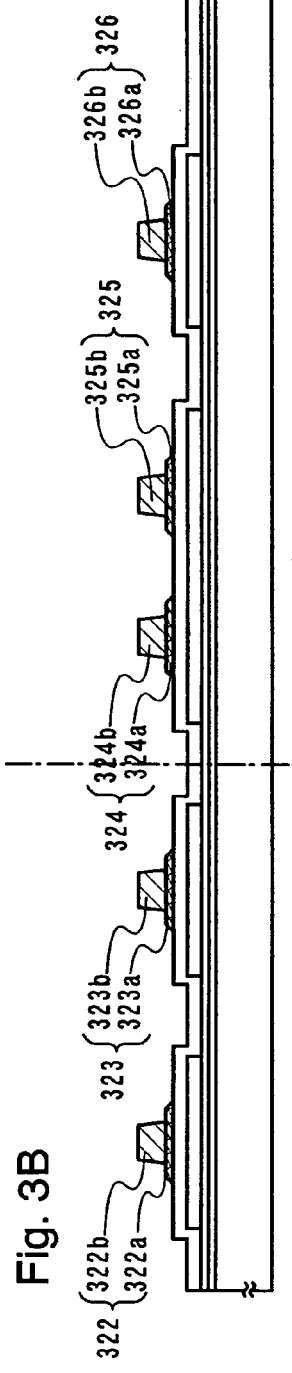

Subsequently, a second etching treatment is performed without removing the mask comprising the resist. Here, a W film is etched selectively. Then, the second conductive layers 322b to 326b are formed by the second etching treatment. On the other hand, the first conductive layers 322a to 326a are hardly etched, and second-shape conductive layers 322 to 326 are formed (FIG. 3B).

An impurity element imparting n-type conductivity is added to the semiconductor layer in low concentration by performing a first doping treatment without removing the mask comprising the resist. The doping treatment may be performed by ion doping or ion implantation. An element belonging to Group 15 in the periodic table, typically phosphorus (P) or arsenic (As) is used for the impurity element imparting n-type conductivity, and phosphorus (P) is used here. In this case, the second-shape conductive layers 322 to 326 becomes a mask for preventing the impurity element imparting n-type conductivity from being doped into the semiconductor layer, and an impurity region is formed in a self-aligned manner. The impurity element imparting n-type conductivity is added to the impurity region in a concentration range of from $1\times10^{18}$ atoms/cm$^3$ to $1\times10^{20}$ atoms/cm$^3$.

Another mask comprising a resist is formed after removing the mask comprising the resist, and a second doping treatment is performed at a higher accelerating voltage than the first doping treatment. The doping treatment is performed by using the second conductive layers 323b, 324b and 325b as a mask for preventing the impurity element from doping into the semiconductor layer so as to add the impurity element to the semiconductor layer below the tapered portion of the first conductive layers 323a, 324a and 325a. Subsequently, a third doping treatment is performed at a lower accelerating voltage than the second doping treatment. According to the second doping treatment and the third doping treatment, a low concentration impurity regions 335 and 338 overlapping the first conductive layer is added with the impurity element imparting n-type conductivity in a concentration range of from $1\times10^{18}$ atoms/cm$^3$ to $5\times10^{19}$ atoms/cm$^3$, and high concentration impurity regions 334 and 337 are added with the impurity element imparting n-type conductivity in a concentration range of from $1\times10^{19}$ atoms/cm$^3$ to $5\times10^{21}$ atoms/cm$^3$.

The low concentration impurity region and the high concentration impurity regions can be formed by one doping treatment of the second doping treatment and the third doping treatment by setting an accelerating voltage appropriately.

Subsequently, yet another mask comprising a resist is formed after removing the mask comprising the resist, and a fourth doping treatment is performed. According to the fourth doping treatment, impurity regions 343, 344, 347, and 348 which are added with an impurity element imparting an opposite conductivity type to the conductivity type of the previously added impurity element to a semiconductor layer to be an active layer of a p-channel TFT are formed. The impurity regions are formed in a self-aligned manner by using the second conductive layers 322b and 326b as masks for preventing the impurity element from doping into the semiconductor layer and by adding an impurity element imparting p-type conductivity. In this example, the impurity regions 343, 344, 347, and 348 are formed by ion doping using diborane ($B_2H_6$). In the case of the fourth doping treatment, a semiconductor layer forming an n-channel TFT is covered with the mask comprising the resist. According to the first to third doping treatments, the impurity regions are doped with phosphorus in different concentrations respectively. However, problems do not arise because the impurity regions function as a source region and a drain region of a p-channel TFT by doping so as to have a concentration of an impurity element imparting p-type conductivity of from $1\times10^{19}$ atoms/cm$^3$ to $5\times10^{21}$ atoms/cm$^3$.

Figure 3C:
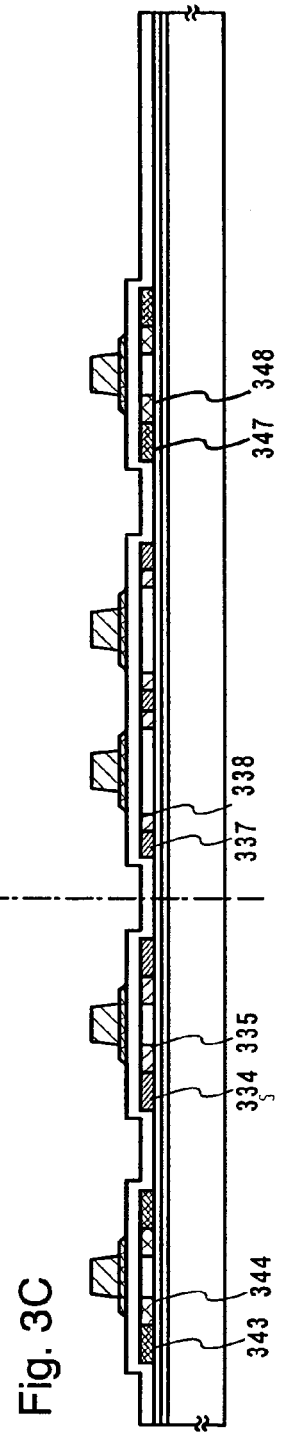

According to the above-described steps, the impurity regions are formed in each semiconductor layer (FIG. 3C).

Subsequently, the mask comprising the resist is removed, and a first insulating film 349 is formed as a passivation film. The first insulating film 349 is formed of an insulating film including silicon to be from 100 nm to 200 nm in thickness by plasma CVD or sputtering (FIG. 4A). The first insulating film 349 is not limited to the silicon oxynitride film, and other insulating films including silicon and having a single layer structure or a laminate structure may be adopted. In this example, a silicon nitride film of 150 nm in thickness is formed by plasma CVD.

Moreover, a step of hydrogenating a semiconductor layer is performed by heat-treating at from 300° C. to 550° C. for from 1 hour to 12 hours in a nitrogen atmosphere. The step is preferably performed at a temperature of from 400° C. to 500° C. The step is a step of terminating dangling bonds of the semiconductor layers by hydrogen contained in the first insulating film 349. In this example, the heat treatment is performed at 410° C. for one hour. Since the hydrogenation is caused by entry of hydrogen in the first insulating film into the semiconductor layer, hydrogen is released from the first insulating film, and hydrogen content in the first insulating film is reduced.

The first insulating film 349 is formed of a material selected from silicon nitride, silicon oxide, silicon oxynitride having more oxygen content than nitrogen content (SiON), silicon nitride oxide (SiNO), aluminum nitride (AlN), aluminum oxynitride having more oxygen content than nitrogen content (AlON), aluminum nitride oxide having more nitrogen content than oxygen content (AlNO), and aluminum oxide.

Before and after the heat treatment, wettability of an insulating film used for the first insulating film 349 changes. For instance, a silicon nitride film used in this example has a contact angle of water of 50° and is hydrophobic after film formation, but the film has a contact angle of 20° after hydrogenation, and becomes hydrophilic.

Thus, due to the treatment performed in a step of manufacturing, a surface of a thin film becomes hydrophilic. Although an organic insulating film to be an interlayer film is formed on a hydrophilized first insulating film 349, a defect such as film peeling is caused due to poor adhesiveness.

Therefore, in the present invention, as shown in FIG. 4B, a second insulating film 351 is formed on the first insulating film 349 after hydrogenation. The second insulating film is a film having a hydrophobic surface. The hydrophobic surface means a surface having a wide contact angle of water, and an insulating surface preferably having a contact angle of equal to or more than 30°, more preferably equal to or more than 40°. As for a film having an insulating surface (insulating film), a film including an inorganic material, or an inorganic insulating film including nitrogen or carbon, or nitrogen and oxygen may be used. Specifically, silicon nitride (SiN), silicon nitride oxide having more nitrogen content than oxygen content (SiNO), silicon carbide (SiC), or the like can be used.

Since the second insulating film 351 in the present invention is not heated as the first insulating film 349 and hydrogen is not released, the second insulating film has higher concentration of contained hydrogen than the first insulating film 349.

In the case of using an inorganic insulating film including nitrogen and oxygen as the film having the hydrophobic surface (the second insulating film) 351 used in the present invention, the inorganic insulating film is preferably an inorganic insulating film having nitrogen concentration in the organic insulating film of equal to or more than 25 atom % or oxygen concentration in the film of less than or equal to 25 atom %. Specifically, a silicon nitride oxide (SiNO) film having nitrogen concentration of equal to or more than 25 atom % or oxygen concentration of less than or equal to 25 atom % can be used.

In the present invention, a silicon oxynitride (SiON) film denotes a film including Si of from 25 atom % to 35 atom %, oxygen of from 55 atom % to 65 atom %, nitrogen of from 1 atom % to 20 atom %, and hydrogen of from 0.1 atom % to 10 atom %. A silicon nitride oxide (SiNO) film denotes a film including Si of from 25 atom % to 35 atom %, oxygen of from 15 atom % to 30 atom %, nitrogen of from 20 atom % to 35 atom %, and hydrogen of from 15 atom % to 25 atom %.

The hydrophobic surface may be formed by nitrogen plasma treatment or fluorine plasma treatment with a non-depositional gas. As for the non-depositional gas, $N_2O$, $N_2$, $NH_3$, $F_2$, $CF_4$, $SiF_4$, or the like can be used.

Before forming the second insulating film 351, heat-treatment, irradiation of intense light, or irradiation of laser light may be carried out in order to activate the impurity element. Simultaneously with the activation, plasma damage of the gate insulating film or of the interface between the gate insulating film and the semiconductor layer can be repaired.

An organic insulating film 350 that is an interlayer film and is made of an organic insulating material is formed on the second insulating film 351. As the organic insulating film 350, a film comprising one kind of or plural kinds of organic resin materials selected from acrylic resin, polyamide, or polyimide of photosensitive or nonphotosensitive, for example, can be used. In this example, a positive photosensitive acrylic film having a film thickness of 1.6 µm is formed. However, the film thickness may be determined appropriately in the range of from 1 µm to 2 µm. Thereafter, a passivation film comprising a nitride insulating film (typically, a silicon nitride film, a silicon nitride oxide film, or a carbon nitride film (CN)) may be formed on the organic insulating film 350.

Thus, the present invention prevents film peeling by forming an insulating film having a hydrophobic surface below an organic insulating film to be used as an interlayer film to improve the adhesiveness of these films. Therefore, according to the present invention, a semiconductor device with high reliability can be manufactured with high yield.

Subsequently, a metal film is formed and etched to form a source electrode, a drain electrode, and each wiring (not shown) for electrically connecting to each impurity region. A film comprising an element of aluminum (Al), titanium (Ti), molybdenum (Mo), tungsten (W), or silicon (Si) or an alloy film with the use of these elements may be used for the metal film. In this example, after laminating a titanium film/a titanium-aluminum alloy film/a titanium film (Ti/Al—Si/Ti) to be 100 nm/350 nm/100 nm in thickness respectively, a source electrode, a drain electrode 352 and each wiring (not shown) are formed by patterning and etching the laminated film into a desired shape.

Figure 5:
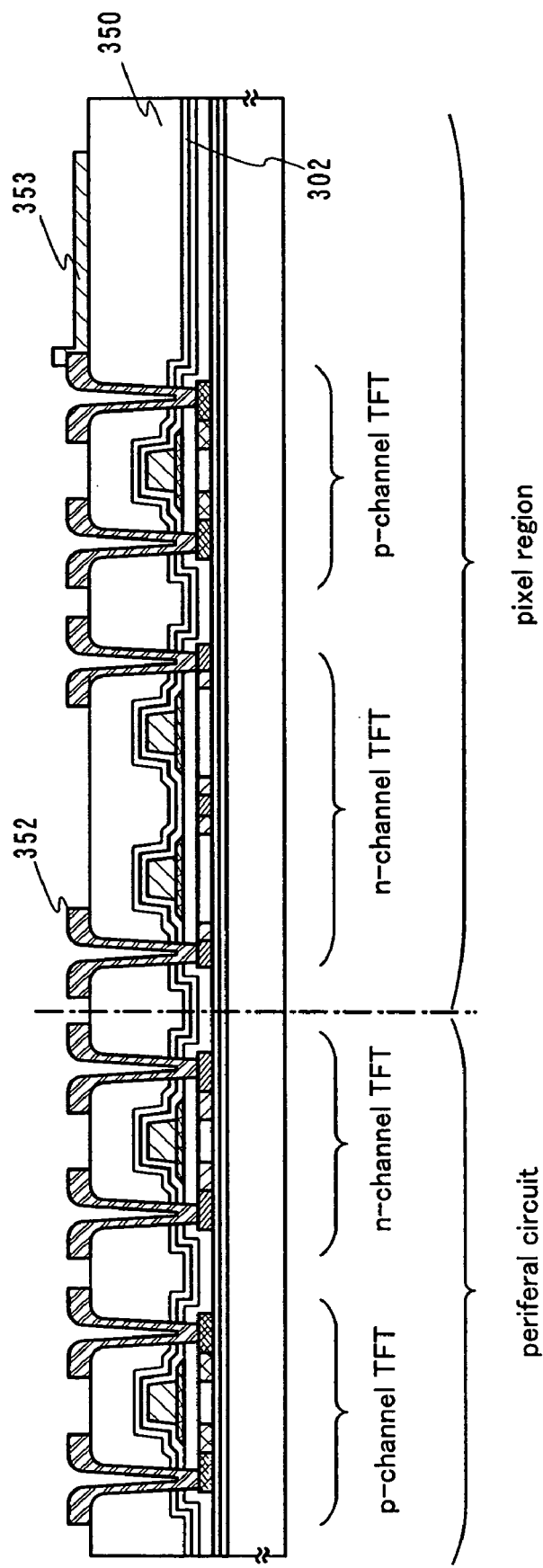
FIG. 5 is a cross-sectional view of an active matrix substrate.

Then, an electrode (an anode or a cathode in an EL display device, or an pixel electrode in a liquid crystal display device) is formed. For the electrode, a transparent conductive film such as ITO or $SnO_2$, or a metal film such as Al in the case of a reflective liquid crystal display device may be used. In this example, an electrode 353 is formed by forming ITO and etching the ITO into a desired shape (FIG. 5).

According to the above-described steps, an active matrix substrate comprising a TFT is completed.

Not limited to a method for manufacturing a TFT described in this example, the present invention can be applied to a top gate type (planar type), a bottom gate type (inversely staggered type), or a dual gate type having two gate electrodes disposed above and below a channel region with a gate insulating film therebetween.

The present invention prevents a defect such as film peeling by forming an insulating film having a hydrophobic surface below the organic insulating film to be used as the interlayer film to improve the adhesiveness of these films. Therefore, according to the present invention, a semiconductor device with high reliability can be manufactured with high yield.

EXAMPLE 3

In this example, an example of using a bottom gate type thin film transistor (specifically, an inversely staggered type TFT as a thin film transistor in Example 2 is described. Namely, the present invention can be applied even if the inversely staggered type TFT is used as a switching TFT and/or a driving TFT in Example 2.

Figure 10:
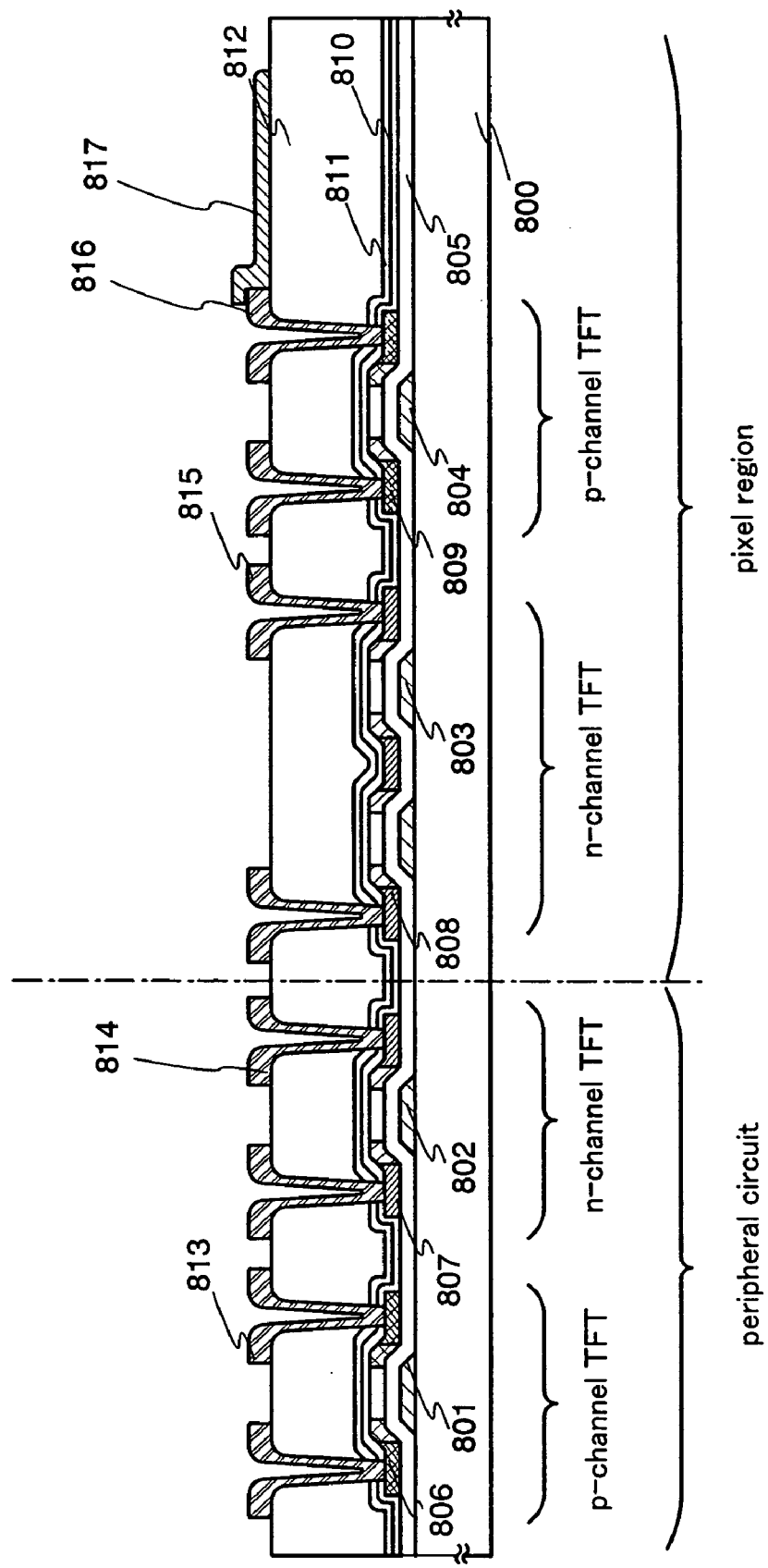
FIG. 10 is a cross-sectional view of an active matrix substrate.

This example is described with reference to FIG. 10. In FIG. 10, conductive layers 801 to 804 to be gate electrodes, a gate insulating film 805, and semiconductor layers 806 to 809 having impurity regions are formed over a substrate 800. In this example, since a material and a formation method are similar to Example 2, a detailed description is not done here, and Example 2 may be referred to.

After forming a first insulating film 810 over the semiconductor layers 806 to 809, the semiconductor layers 806 to 809 are hydrogenated by heat-treating at a temperature of 410° C. for one hour in a nitrogen atmosphere. Dangling bonds of the semiconductor layers are terminated by hydrogenation. Since the hydrogenation is caused by entry of hydrogen in the first insulating film into the semiconductor layers, hydrogen is released from the first insulating film 810 and hydrogen concentration in the first insulating film 810 is lowered.

The first insulating film 810 is formed of a material selected from silicon nitride, silicon oxide, silicon oxynitride having more oxygen content than nitrogen content (SiON), silicon nitride oxide (SiNO), aluminum nitride (AlN), aluminum oxynitride having more oxygen content than nitrogen content (AlON), aluminum nitride oxide having more nitrogen content than oxygen content (AlNO), or aluminum oxide.

Before and after the heat treatment, wettability of an insulating film used for the first insulating film 810 changes. For instance, a silicon nitride film used in this example has a contact angle of water of 50° and is hydrophobic after film formation, but the film has a contact angle of 20° after hydrogenation, and becomes hydrophilic.

Thus, due to the treatment performed in a step of manufacturing, a/the surface of a thin film becomes hydrophilic. Although an organic insulating film is formed on a hydrophilized first insulating film 810, a defect such as film peeling is caused due to poor adhesiveness.

Therefore, in the present invention, a second insulating film 811 is formed on the first insulating film 810 after hydrogenation. The second insulating film is a film having a hydrophobic surface. The hydrophobic surface means a surface having a wide contact angle of water, and an insulating surface preferably having a contact angle of equal to or more than 30°, more preferably equal to or more than 40°. As for a film having an insulating surface (insulating film), an inorganic insulating film, for instance, an inorganic insulating film including nitrogen, carbon, or nitrogen and oxygen may be used. Specifically, silicon nitride (SiN), silicon nitride oxide having more nitrogen content than oxygen content (SiNO), silicon carbide (SiC), or the like can be used.

Since the second insulating film 811 used in the present invention is not heated as the first insulating film 810, the second insulating film has more hydrogen content and higher hydrogen concentration than the first insulating film 810.

In the case of using an inorganic insulating film including nitrogen and oxygen as the film having the hydrophobic surface (the second insulating film) 811 used in the present invention, the inorganic insulating film is preferably an inorganic insulating film having nitrogen concentration in the inorganic insulating film of equal to or more than 25 atom % or the one having oxygen concentration in the film of less than or equal to 25 atom %. Specifically, a silicon nitride oxide (SINO) film having nitrogen concentration of equal to or more than 25 atom % or oxygen concentration of less than or equal to 25 atom % can be used.

In the present invention, a silicon oxynitride (SiON) film denotes a silicon oxynitride film including Si of from 25 atom % to 35 atom %, oxygen of from 55 atom % to 65 atom %, nitrogen of from 1 atom % to 20 atom %, and hydrogen of from 0.1 atom % to 10 atom %. A silicon nitride oxide (SINO) film denotes a silicon nitride oxide film including Si of from 25 atom % to 35 atom %, oxygen of from 15 atom % to 30 atom %, nitrogen of from 20 atom % to 35 atom %, and hydrogen of from 15 atom % to 25 atom %.

The hydrophobic surface may be formed by nitrogen plasma treatment or fluorine plasma treatment with a non-depositional gas. As for the non-depositional gas, $N_2O$, $N_2$, $NH_3$, $F_2$, $CF_4$, or $SiF_4$ can be used.

An organic insulating film 812 that is an interlayer film and is made of an organic insulating material is formed on the second insulating film 811. As the organic insulating film 812, a film comprising one kind of or plural kinds of organic resin materials selected from acrylic resin, polyamide, or polyimide of photosensitive or nonphotosensitive, for example, can be used. In this example, positive photosensitive acrylic film having film thickness of 1.6 μm is formed. However, the film thickness may be determined appropriately in the range of from 1 μm to 2 μm. Thereafter, a passivation film comprising a nitride insulating film (typically, a silicon nitride film, a silicon nitride oxide film, or a carbon nitride film (CN)) may be formed on the organic insulating film 812.

Thus, the present invention prevents film peeling by forming an insulating film having a hydrophobic surface below an organic insulating film to be used as an interlayer film to improve the adhesiveness of these films. Therefore, according to the present invention, a semiconductor device with high reliability can be manufactured with high yield.

Subsequently, a metal film is formed and etched to form a source electrode, a drain electrode, and each wiring (not shown) for electrically connecting to each impurity region. A film comprising an element of aluminum (Al), titanium (Ti), molybdenum (Mo), tungsten (W), or silicon (Si), or an alloy film with the use of these elements may be used for the metal film. In this example, after laminating a titanium film/a titanium-aluminum alloy film/a titanium film (Ti/Al—Si/Ti) to be 100 nm/350 nm/100 nm in thickness respectively, a source electrode, a drain electrode 815 and each wiring (not shown) are formed by patterning and etching the laminated film into a desired shape.

Then, an electrode (an anode or a cathode in an EL display device or a pixel electrode in a liquid crystal display device) is formed. For the electrode, a transparent conductive film such as ITO and $SnO_2$ or a metal film such as Al in the case of a reflective liquid crystal display device may be used. In this example, an electrode 817 is formed by forming ITO and etching the ITO into a desired shape.

According to the above-described steps, an active matrix substrate comprising a bottom gate TFT is completed.

EXAMPLE 4

In this example, an example of manufacturing a display device using an active matrix substrate described in Example 1 as a semiconductor device of the present invention is described. The display device includes a display panel in which a light-emitting device formed on a substrate is sealed with a covering material, and a display module comprising the display panel provided with a TFT. The light-emitting device includes a layer having an organic compound providing electro luminescence generated by being applied with an electric field (a light-emitting layer), an anode layer, and a cathode layer. The luminescence of the organic compound includes light emission (fluorescence) generated when restoring from a singlet excitation state to the ground state, and light emission (phosphorescence) when restoring from a triplet excitation state to the ground state. An EL material which can be used in the present invention includes all luminescent materials emitting light by either or both the singlet excitation and the triplet excitation.

In the present invention, all layers formed between the anode and the cathode in the light-emitting device are defined as an organic light-emitting layer. The organic light-emitting layer specifically includes a light-emitting layer, a hole injection layer, an electron injection layer, a hole transport layer, an electron transport layer, and the like. Basically, the light-emitting device has a laminated structure in order of an anode layer, a light-emitting layer, and a cathode layer. As well as the structure, the light-emitting device may have such structure in which an anode layer, a hole injection layer, a light-emitting layer, and a cathode layer, or an anode layer, a hole injection layer, a light-emitting layer, an electron transport layer, and a cathode layer are laminated in order.

Figure 6:
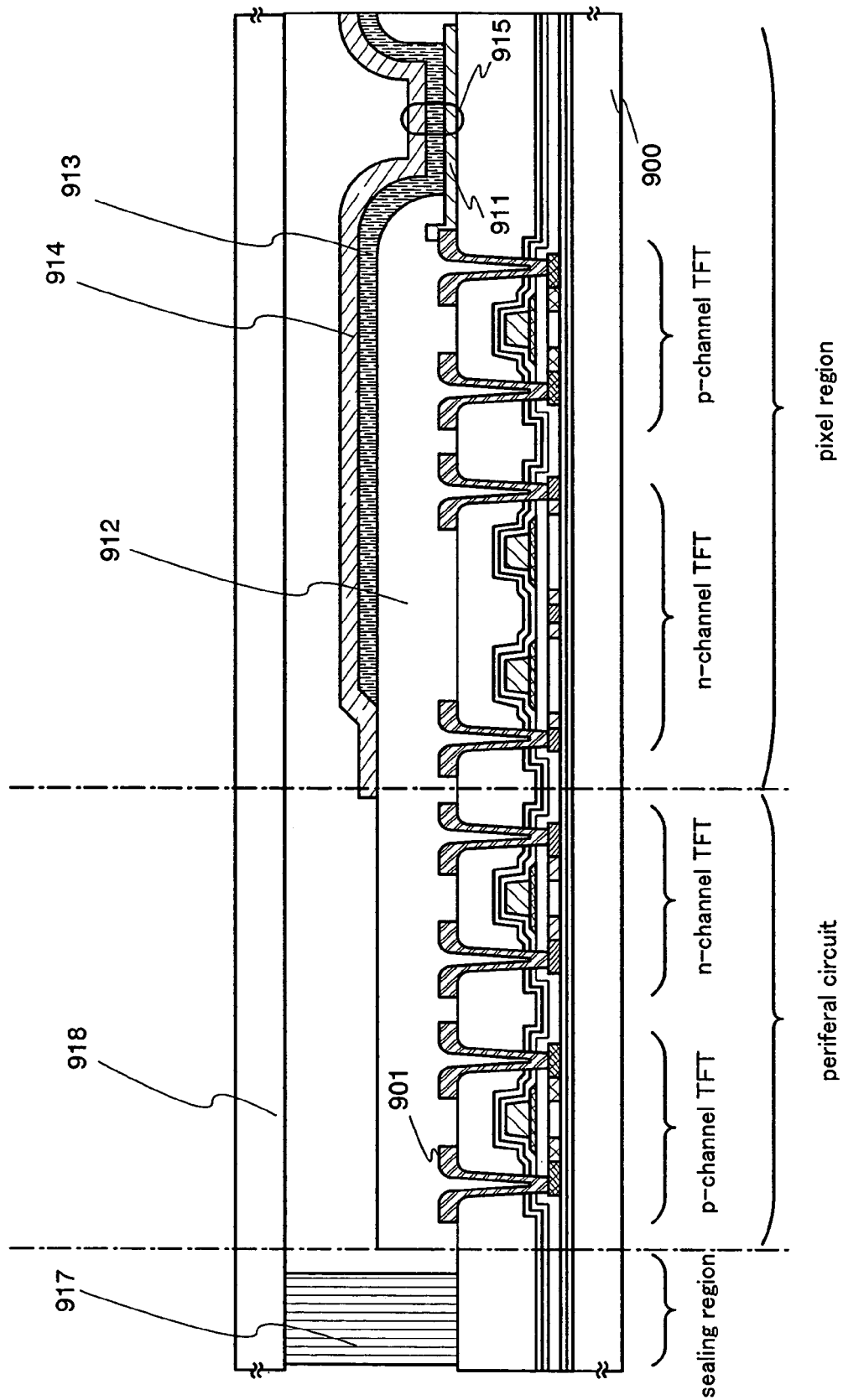
FIG. 6 shows an example of a semiconductor device of the present invention.

FIG. 6 is a cross-sectional view of a semiconductor device of this example. In FIG. 6, a drive circuit provided over a substrate 900 is formed by using a CMOS circuit of FIG. 5. Thus, description of a structure may be referred to the description of an n-channel TFT and a p-channel TFT. In this example, a single gate structure is described; however, a double gate structure or a triple gate structure may be adopted.

An n-channel TFT and a p-channel TFT of a pixel region are also formed by using the n-channel TFT and the p-channel TFT in FIG. 5. Therefore, a description of a structure may be referred to the description of the n-channel TFT and the p-channel TFT in FIG. 5. In this example, a single gate structure is shown; however, a double gate structure or a triple gate structure may be adopted.

Reference numeral 901 denotes an electrode that is superposed on the pixel electrode 911, thereby electrically connecting to a pixel electrode 911 of a current control TFT.

Reference numeral 911 denotes a pixel electrode comprising a transparent conductive film (an anode of a light-emitting device). A compound of indium oxide with tin oxide, a compound of indium oxide with zinc oxide, zinc oxide, tin oxide, or indium oxide can be used for the transparent conductive film. A film formed by adding gallium to the transparent conductive film may be used. The pixel electrode 911 may be formed on a flat interlayer insulating film before forming the above-described electrode. At this time, in the case of using an organic insulating film comprising an organic resin or the like as in the present invention, a defect such as film peeling can be prevented by making a base film have a hydrophobic surface to improve adhesiveness. This can be applied similarly to a bank 912 described below. It is effective to planarize a step due to a TFT by using a planarizing film comprising resin. Since a light-emitting layer to be formed later is very thin, the step may cause a defect in light emission. Consequently, the planarization is preferably performed before forming the pixel electrode so as to form the light-emitting layer on a surface as smooth as possible.

A bank 912 is formed after forming the electrode 901. The bank 912 may be formed by patterning an insulating film or an organic resin film including silicon of from 100 nm to 400 nm.

Since the bank 912 is an insulating film, electrostatic discharge damage to a device in deposition needs attention. In this example, the resistivity is reduced by adding a carbon particle or a metal particle into an insulating film to be a material of the bank, thereby suppressing generation of static electricity. At this time, the amount of a carbon particle or a metal particle to be added may be adjusted in order for the resistivity to be from $1 \times 10^6$ Ωm to $1 \times 10^{12}$ Ωm (preferably from $1 \times 10^8$ Ωm to $1 \times 10^{10}$ Ωm).

A light-emitting layer 913 is formed on the pixel electrode 911. Only one pixel is shown in FIG. 6; however, in this example, light-emitting layers corresponding to respective colors of R (red), G (green), and B (blue) are formed separately. In this example, a low molecular weight organic light-emitting material is formed by vapor deposition. Specifically, the light-emitting layer has a laminate structure having a copper phthalocyanine (CuPc) film provided with a thickness of 20 nm as the hole injection layer and a tris-8-quinolinolato aluminum complex ($Alq_3$) film provided thereupon with a thickness of 70 nm as the light-emitting layer. Color of emission light can be controlled by adding fluorescent dye such as quinacridone, perylene, or DCM 1 to $Alq_3$.

However, the foregoing example is an example of the organic light-emitting material to be used for the light-emitting layer and the organic light-emitting material is not necessarily limited thereto. The light-emitting layer (layer for light emission and for carrier movement for the light emission) may be formed by freely combining the light-emitting layer, the charge transport layer, and the charge injection layer. For example, although the example in which the low molecular weight organic light-emitting material is used for the light-emitting layer is described in this example, an intermediate molecular weight organic light-emitting material or a high molecular weight organic light-emitting material may be used in place. In the present invention, an organic light-emitting material which does not sublimate and has molecularity of equal to or less than 20 or a molecular chain length of equal to or less than 10 μm is defined as the intermediate molecular weight organic light-emitting material. In addition, as an example of using the high molecular weight organic light-emitting material, a laminate structure having a polythiophene (PEDOT) film provided by spin coating with a thickness of 20 nm as the hole injection layer and a paraphenylene-vinylene (PPV) film with a thickness of approximately 100 nm provided thereupon as the light-emitting layer may be given. In addition, emission wavelength can be selected from red through blue by using i-conjugated polymer of PPV. An inorganic material such as silicon carbide can be used for the charge transport layer and the charge injection layer. These organic light-emitting materials and inorganic materials are formed by using known materials.

Next, a cathode 914 comprising a conductive film is provided on the light-emitting film 913. In this example, an alloy film of aluminum and lithium is used as the conductive film. A known MgAg film (alloy film of magnesium and silver) may be used alternatively. A conductive film comprising an element belonging to Group 1 or 2 of the periodic table or a conductive film added with the elements may be used as a cathode material.

A light-emitting device 915 is completed at the time of forming up to the cathode 914. The light-emitting device 915 herein refers to a diode formed with the pixel electrode (anode) 911, the light-emitting layer 913, and the cathode 914.

It is effective to provide a passivation film (not shown) so as to completely cover the light-emitting device 915. The passivation film is made of an insulating film including a carbon film, a silicon nitride film, a carbon nitride film (CN), or a silicon nitride oxide film, and the insulating film is used in a single layer or a combined lamination.

In such the case, a film favorable in coverage is preferably used as the passivation film. It is effective to use a carbon film, particularly a DLC film. Since the DLC film can be formed in a temperature range of from room temperature to equal to or less than 100° C., the DLC film can be easily formed over the light-emitting layer 913 having low heat resistance. The DLC film has a high blocking effect to oxygen and can suppress oxidization of the light-emitting layer 913. Consequently, a problem of oxidation of the light-emitting layer 913 during the following sealing step can be avoided.

Furthermore, a sealing material 917 is provided on the passivation film (not shown) to bond a covering material 918. An ultraviolet curable resin may be used for the sealing material 917. It is effective to provide a substance having a hygroscopic effect or an antioxidant effect inside. In addition, in this example, carbon films (preferably DLC films) are formed on both sides of a glass substrate, a quartz substrate, a plastic substrate (including a plastic film), or a flexible substrate, thereby obtaining the covering material 918. An aluminum film (AlON, AlN, AlO, or the like), SiN, or the like can be used as well as the carbon film.

Thus, a semiconductor device having a structure as shown in FIG. 6 is completed. It is effective to continuously carry out the steps of up to forming the passivation film (not shown) after forming the bank by using a deposition apparatus of a multi-chamber system (or an in-line system) without exposure to the atmosphere. In addition, with further development, the steps of up to sealing with the covering material 918 can be carried out without exposure to the atmosphere.

By providing an impurity region overlapping a gate electrode with an insulating film therebetween, an n-channel TFT resistive to deterioration resulting from a hot-carrier effect can be formed. Consequently, a semiconductor device with high reliability can be realized.

In addition, in this example, only a structure of a pixel portion and a drive circuit is shown. However, according to the manufacturing steps in this example, logic circuits such as a signal division circuit, a D/A converter, an operation amplifier, and a γ-correction circuit also can be formed on the same insulator. Furthermore, a memory or a microprocessor can be formed thereon.

The present invention prevents a defect such as film peeling by forming a film having a hydrophobic surface below an organic insulating film to be used as an interlayer film to improve the adhesiveness of these films. Therefore, according to the present invention, a semiconductor device with high reliability can be manufactured with high yield.

EXAMPLE 5

Various semiconductor devices can be manufactured by applying the present invention. Namely, the present invention can be applied to various electronics in which the semiconductor devices are respectively mounted. Moreover, reliability of the electronics can be improved by applying the present invention.

The following can be given as such electronics: a video camera; a digital camera; a projector; a head mounted display (a goggle type display); a car navigation system; a car stereo; a personal computer; a mobile information terminal (a mobile computer, a cellular phone, or an electronic book); and the like. Examples of the electronics are shown in FIGS. 7A to 7F, 8A to 8D, and 9A to 9C.

Figure 7A:
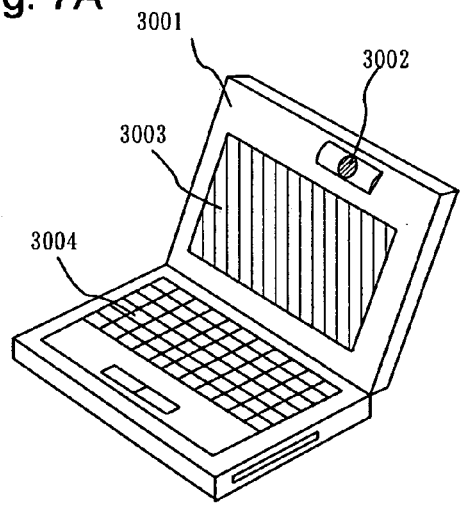
FIGS. 7A to 7F show examples of semiconductor devices.

FIG. 7A is a personal computer including a main body 3001, an image input portion 3002, a display portion 3003, and a keyboard 3004, and the like. The personal computer of the present invention is completed by applying the present invention to the display portion 3003.

Figure 7B:
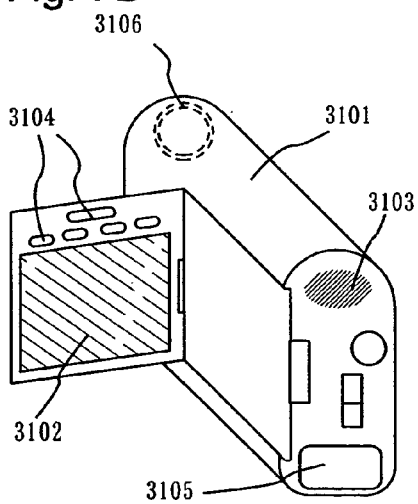

FIG. 7B is a video camera including a main body 3101, a display portion 3102, a voice input portion 3103, operation switches 3104, a battery 3105, an image receiving portion 3106, and the like. The video camera of the present invention is completed by applying the present invention to the display portion 3102.

Figure 7C:
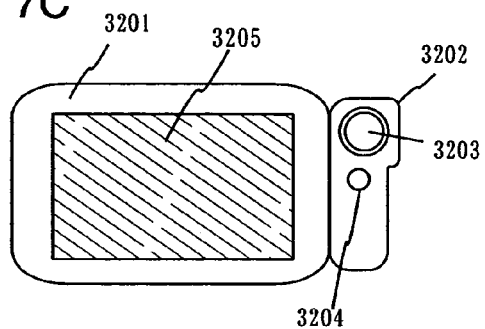

FIG. 7C is a mobile computer including a main body 3201, a camera section 3202, an image receiving portion 3203, an operation switch 3204, a display portion 3205, and the like. The mobile computer of the present invention is completed by applying the present invention to the display portion 3205.

Figure 7D:
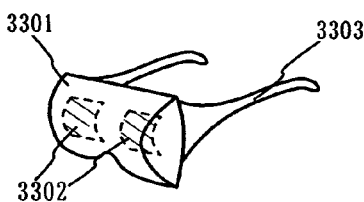

FIG. 7D is a goggle type display including a main body 3301, a display portion 3302, an arm portion 3303, and the like. A flexible substrate is used as a substrate for the display portion 3302, and the goggle type display is manufactured by making the display portion 3302 curved. A lightweight and thin goggle type display is realized. The goggle type display of the present invention is completed by applying the present invention to the display portion 3302.

Figure 7E:
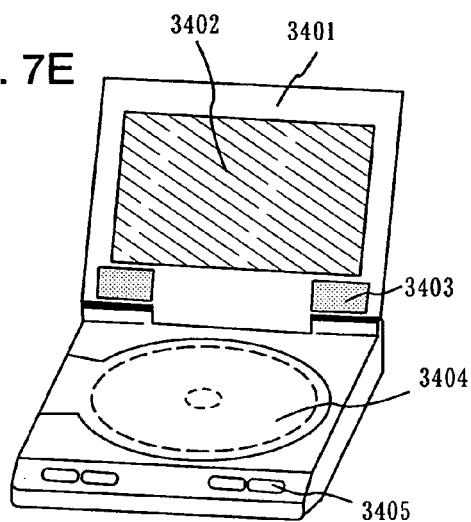

FIG. 7E is a player using a recording medium recording a program (hereinafter, referred to as a recording medium) which includes a main body 3401, a display portion 3402, a speaker portion 3403, a recording medium 3404, operation switches 3405, and the like. The player uses a DVD (digital versatile disc), a CD, and the like as the recording medium, and can be used for music appreciation, film appreciation, games, and Internet. The recording medium of the present invention is completed by applying the present invention to the display portion 3402.

Figure 7F:
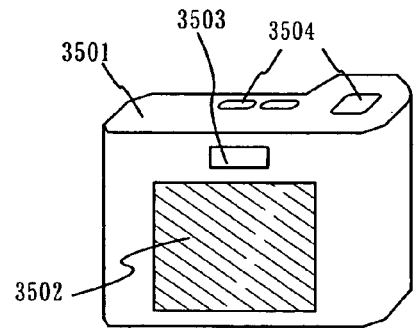

FIG. 7F is a digital camera including a main body 3501, a display portion 3502, a view finder 3503, operation switches 3504, an image receiving portion (not shown), and the like. The digital camera of the present invention is completed by applying the present invention to the display portion 3502.

Figure 8A:
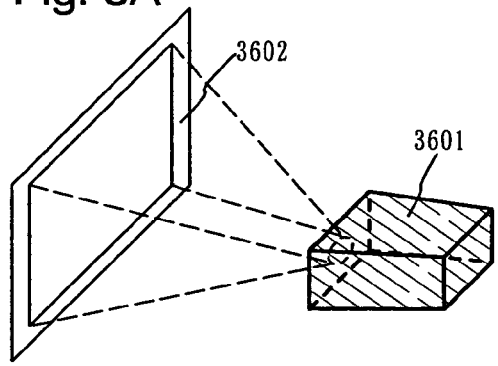
FIGS. 8A to 8D show examples of semiconductor devices.

FIG. 8A is a front type projector including a projection apparatus 3601, a screen 3602, and the like. The front type projector of the present invention is completed by applying the present invention to a liquid crystal display device 3808 constituting a part of the projection apparatus 3601 and to other drive circuits.

Figure 8B:
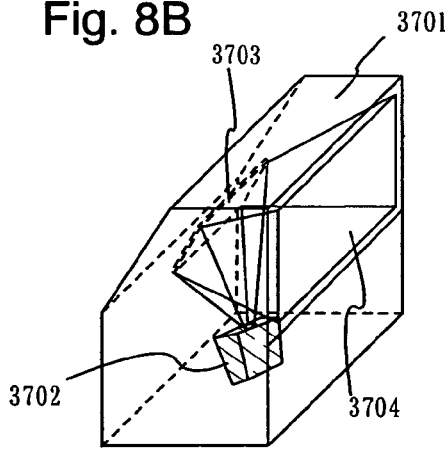

FIG. 8B is a rear type projector including a main body 3701, a projection apparatus 3702, a mirror 3703, a screen 3704, and the like. The rear type projector of the present invention is completed by applying the present invention to the liquid crystal display device 3808 constituting a part of the projection apparatus 3702 and to other drive circuits.

Figure 8C:
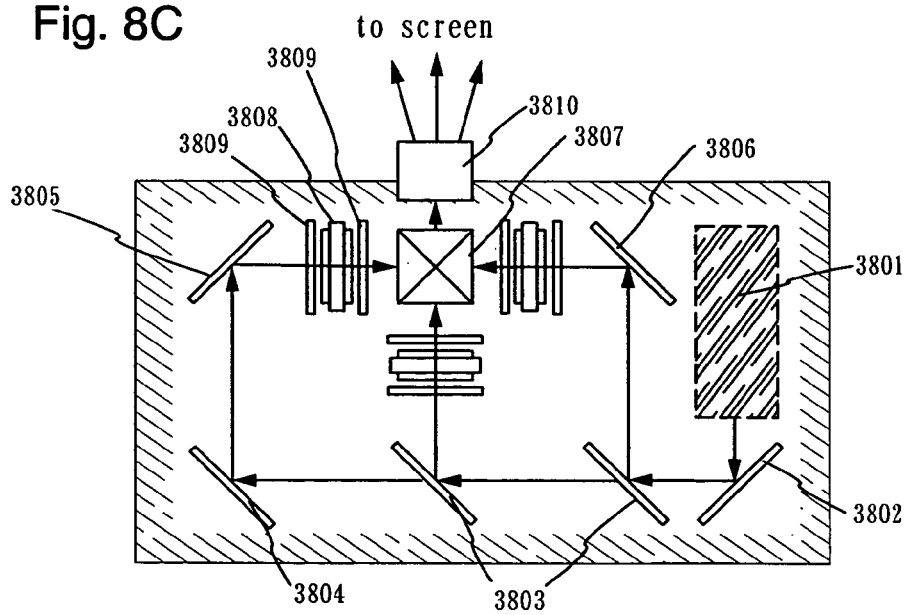

FIG. 8C shows an example of structures of the projection apparatuses 3601 and 3702 respectively in FIGS. 8A and 8B. Each of the projection apparatuses 3601 and 3702 comprise a light source optical system 3801, mirrors 3802 and 3804 to 3806, a dichroic mirror 3803, a prism 3807, a liquid crystal display device 3808, a retardation plate 3809, and a projection optical system 3810. The projection optical system 3810 comprises an optical system including a projection lens. Though this example shows an example of a three-plate type, there is no particular limitation thereto, and a single-plate type may be used for instance. Further, an optical system such as an optical lens, a film having a function of polarizing light, a film for adjusting a phase difference, an IR film, or the like may be appropriately disposed in an optical path shown by an arrow in FIG. 8C.

Figure 8D:
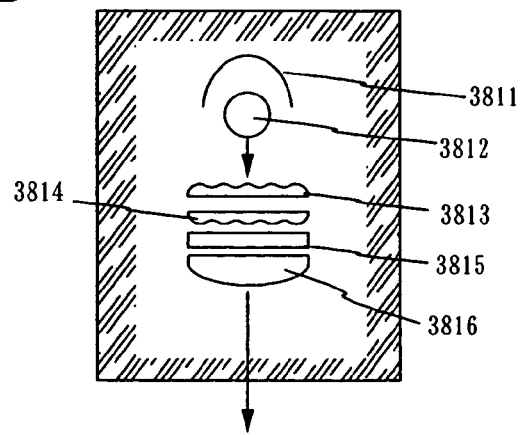

FIG. 8D shows an example of a structure of the light source optical system 3801 in FIG. 8C. In this example, the light source optical system 3801 comprises a reflector 3811, a light source 3812, lens arrays 3813 and 3814, a polarizing conversion device 3815, and a condenser lens 3816. Note that the light source optical system shown in FIG. 8D is merely an example and the structure is not particularly limited thereto. For instance, an optical system such as an optical lens, a film having a function of polarizing light, a film for adjusting a phase difference, an IR film, or the like may be appropriately disposed in the light source optical system.

Note that a transmission type electro-optical apparatus is used in the case of the projectors shown in FIGS. 8A to 8D, and examples of applying a reflection type electro-optical device and a display device are not shown in the figures.

Figure 9A:
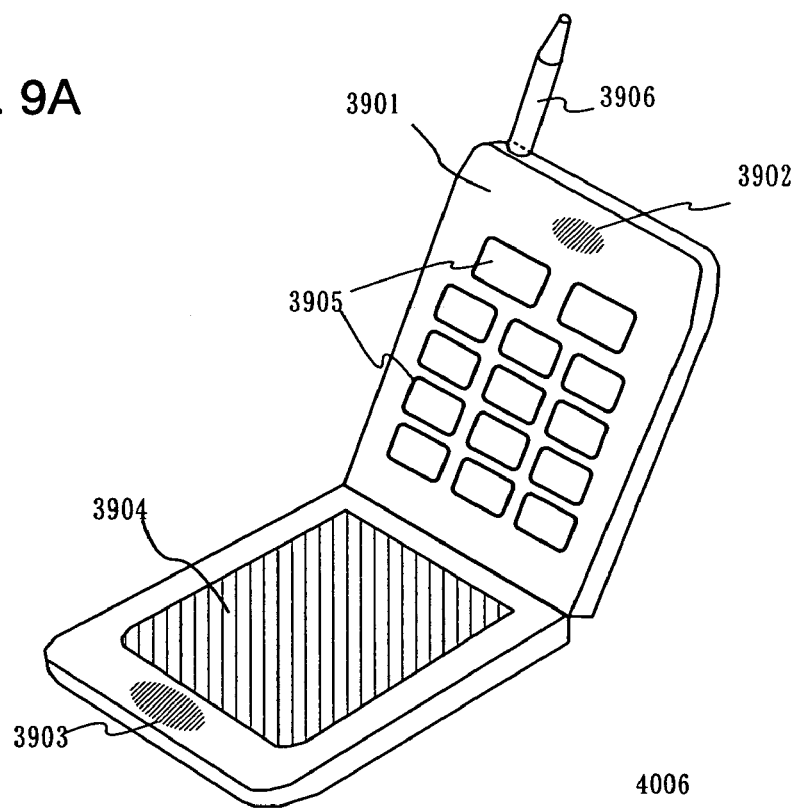
FIGS. 9A to 9C show examples of semiconductor devices.

FIG. 9A is a cellular phone including a main body 3901, a voice output portion 3902, a voice input portion 3903, a display portion 3904, operation switches 3905, an antenna 3906, and the like. The cellular phone of the present invention is completed by applying the present invention to the display portion 3904.

Figure 9B:
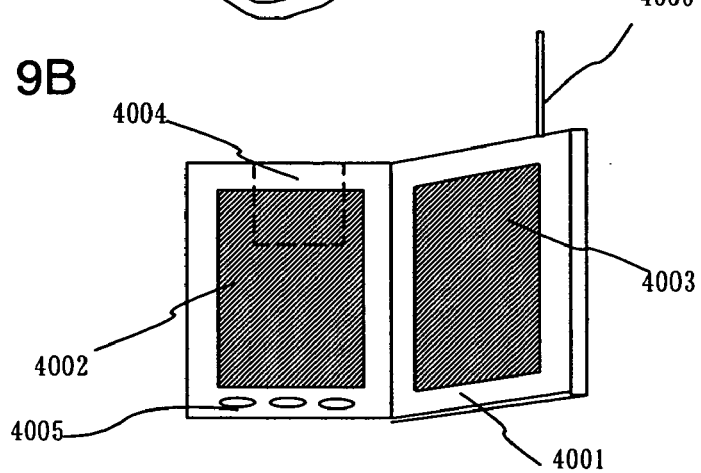

FIG. 9B is a portable book (electronic book) including a main body 4001, display portions 4002 and 4003, a recording medium 4004, operation switches 4005, an antenna 4006, and the like. The mobile book of the present invention is completed by applying the present invention to the display portions 4002 and 4003.

Figure 9C:
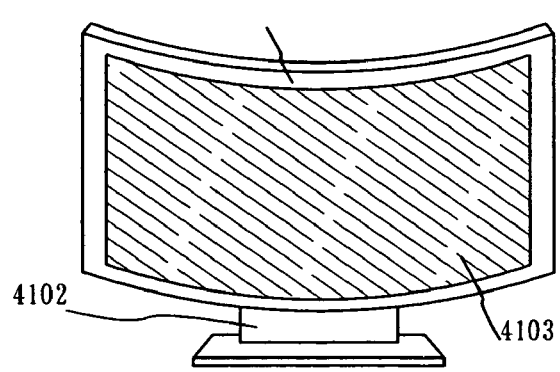

FIG. 9C is a display including a main body 4101, a supporting section 4102, a display portion 4103, and the like. The display portion 4103 is manufactured by using a flexible substrate, thereby realizing a lightweight and thin display. In addition, the display portion can be made curved. The display of the present invention is completed by applying the present invention to the display portion 4103.

As described above, the present invention can be fairly widely applied to electronics in various fields.

This application is based on Japanese Patent Application serial no. 2003-089660 filed in Japan Patent Office on Mar. 28 in 2003, the contents of which are hereby incorporated by reference.

TABLE 1

| base film | SiN | | | SiNO | | |
|---|---|---|---|---|---|---|
| sample | SiN(a) | SiN(b) | SiN(c) | SiNO(a) | SiNO(b) | SiNO(c) |
| hydrofluoric acid treatment (120 sec) | ○ | | | ○ | | |
| hydro washing (60 sec) | | ○ | | | ○ | |
| hydrofluoric acid treatment (120 sec) | | ○ | | | ○ | |
| water washing | | ○ | | | ○ | |
| heat-treatment (150° C. 3 min) | | ○ | | | ○ | |
| applying a positive photosensitive acrylic resin | | ○ | | | ○ | |
| washing periphery of sample | | ○ | | | ○ | |
| exposure | | ○ | | | ○ | |
| development | | ○ | | | ○ | |
| water contact angle (degree) (after deposition) | | 50 | | | 44 | |
| wettability of the positive photosensitive acrylic resin (after applying) | ○ | ○ | ○ | ○ | ○ | ○ |
| adhesiveness of patterns (after development) | ○ | ○ | ○ | X | X | ○ |

TABLE 2

| base film | SiON | | | SiO$_2$ | | |
|---|---|---|---|---|---|---|
| sample | SiON(a) | SiON(b) | SiON(c) | SiO$_2$(a) | SiO$_2$(b) | SiO$_2$(c) |
| hydrofluoric acid treatment (120 sec) | ○ | | | ○ | | |
| hydro washing (60 sec) | | ○ | | | ○ | |
| hydrofluoric acid treatment (120 sec) | | ○ | | | ○ | |
| water washing | | ○ | | | ○ | |
| heat-treatment (150° C. 3 min) | | ○ | | | ○ | |
| applying a positive photosensitive acrylic resin | | ○ | | | ○ | |
| washing periphery of sample | | ○ | | | ○ | |
| exposure | | ○ | | | ○ | |
| development | | ○ | | | ○ | |
| water contact angle (degree) (after deposition) | | 24 | | | 15 | |
| wettability of the positive photosensitive acrylic resin (after applying) | ○ | ○ | ○ | ○ | ○ | ○ |
| adhesiveness of patterns (after development) | X | X | X | X | X | X |

What is claimed is:

1. A semiconductor device, comprising:
a first inorganic insulating film on a semiconductor layer;
a second inorganic insulating film including silicon and nitrogen on the first inorganic insulating film;
an organic insulating film formed in close contact with the second inorganic insulating film;
wherein the first inorganic insulating film and the second insulating film are a nitride; and
wherein the surface of the second inorganic insulating film has a larger contact angle of water than the surface of the first inorganic insulating film.

2. A semiconductor device according to claim 1, wherein the second inorganic insulating surface has a contact angle of water of equal to or more than 30°.

3. A semiconductor device according to claim 1, wherein the second inorganic insulating surface has a contact angle of water of equal to or more than 40°.

4. A semiconductor device according to claim 1, wherein the inorganic insulating film or the second inorganic insulating film includes oxygen and the nitrogen of equal to or more than 25 atom %.

5. A semiconductor device according to claim 1, wherein the inorganic insulating film or the second inorganic insulating film is a silicon nitride film or a silicon nitride oxide film.

6. A semiconductor device according to claim 1, wherein the organic insulating film includes one of or a plurality of organic resin materials selected from acrylic resin, polyamide, or polyimide of photosensitive or nonphotosensitive.

7. A semiconductor device, comprising:
a first inorganic insulating film including silicon and nitrogen on a semiconductor layer;
a second inorganic insulating film including silicon and nitrogen on the first inorganic insulating film;
an organic insulating film formed in close contact with a the second inorganic insulating film;
wherein the first inorganic insulating film and the second insulating film are a nitride;
wherein the surface of the second inorganic insulating film has a larger contact angle of water than the surface of the first inorganic insulating film; and
wherein hydrogen concentration in the second inorganic insulating film is higher than hydrogen concentration in the first inorganic insulating film.

8. A semiconductor device according to claim 7, wherein the second inorganic insulating surface has a contact angle of water of equal to or more than 30°.

9. A semiconductor device according to claim 7, wherein the second inorganic insulating surface has a contact angle of water of equal to or more than 40°.

10. A semiconductor device according to claim 7, wherein the inorganic insulating film or the second inorganic insulating film includes oxygen and the nitrogen of equal to or more than 25 atom %.

11. A semiconductor device according to claim 7, wherein the inorganic insulating film or the second inorganic insulating film is a silicon nitride film or a silicon nitride oxide film.

12. A semiconductor device according to claim 7, wherein the organic insulating film includes one of or a plurality of organic resin materials selected from acrylic resin, polyamide, or polyimide of photosensitive or nonphotosensitive.

13. A semiconductor device, comprising:
a first inorganic insulating film on a semiconductor layer;
a second inorganic insulating film including silicon and nitrogen on the first inorganic insulating film;
an organic insulating film formed in close contact with the second inorganic insulating film;
wherein the first inorganic insulating film and the second insulating film are a nitride;
wherein the surface of the second inorganic insulating film has a larger contact angle of water than the surface of the first inorganic insulating film;
wherein hydrogen concentration in the second inorganic insulating film is higher than hydrogen concentration in the first inorganic insulating film; and
wherein the first inorganic insulating film and the second insulating film are the same material.

14. A semiconductor device according to claim 13, wherein the second inorganic insulating surface has a contact angle of water of equal to or more than 30°.

15. A semiconductor device according to claim 13, wherein the second inorganic insulating surface has a contact angle of water of equal to or more than 40°.

16. A semiconductor device according to claim 13, wherein the inorganic insulating film or the second inorganic insulating film includes oxygen and the nitrogen of equal to or more than 25 atom %.

17. A semiconductor device according to claim 13, wherein the inorganic insulating film or the second inorganic insulating film is a silicon nitride film or a silicon nitride oxide film.

18. A semiconductor device according to claim 13, wherein the organic insulating film includes one of or a plurality of organic resin materials selected from acrylic resin, polyamide, or polyimide of photosensitive or nonphotosensitive.

* * * * *